(12) United States Patent
Oshima et al.

(10) Patent No.: US 9,159,903 B2
(45) Date of Patent: Oct. 13, 2015

(54) PIEZOELECTRIC MATERIAL, PIEZOELECTRIC ELEMENT, AND ELECTRONIC EQUIPMENT

(71) Applicant: CANON KABUSHIKI KAISHA, Tokyo (JP)

(72) Inventors: Kanako Oshima, Tokyo (JP); Takayuki Watanabe, Yokohama (JP); Shunsuke Murakami, Kawasaki (JP); Hidenori Tanaka, Yokohama (JP); Jumpei Hayashi, Yokohama (JP); Hiroshi Saito, Kawasaki (JP); Takanori Matsuda, Chofu (JP)

(73) Assignee: Canon Kabushiki Kaisha, Tokyo (JP)

( * ) Notice: Subject to any disclaimer, the term of this patent is extended or adjusted under 35 U.S.C. 154(b) by 0 days.

(21) Appl. No.: 14/329,689

(22) Filed: Jul. 11, 2014

(65) Prior Publication Data

US 2015/0015643 A1  Jan. 15, 2015

(30) Foreign Application Priority Data

Jul. 12, 2013  (JP) ................................ 2013-146310

(51) Int. Cl.
*B41J 2/045* (2006.01)
*H01L 41/18* (2006.01)
(Continued)

(52) U.S. Cl.
CPC ............ *H01L 41/183* (2013.01); *B06B 1/0644* (2013.01); *B41J 2/045* (2013.01);
(Continued)

(58) Field of Classification Search
CPC ............... B41J 2002/14266; B41J 2202/03; B41J 2/1607; B41J 2/1612; B41J 2002/14258; B41J 2/14201
USPC .................. 347/44, 68–72; 310/311
See application file for complete search history.

(56) References Cited

U.S. PATENT DOCUMENTS 8,547,001 B2 * 10/2013 Saito et al. .................... 310/358
8,562,113 B2   10/2013 Harigai
(Continued)

FOREIGN PATENT DOCUMENTS

CN   1635592 A   7/2005
CN   101026035 A  8/2007
(Continued)

OTHER PUBLICATIONS

Karaki, T., et al., "Modified BaTiO3 Piezoelectric Ceramics with Bi2O3—Li2O Additive", Ferroelectrics, 2012, pp. 83-87, 439.
(Continued)

*Primary Examiner* — An Do
(74) *Attorney, Agent, or Firm* — Canon USA Inc. IP Division

(57) ABSTRACT

A piezoelectric material contains a main component containing a perovskite-type metal oxide having the formula (1); a first auxiliary component composed of Mn; and a second auxiliary component composed of Bi or Bi and Li, wherein the Mn content is 0.04 parts by weight or more and 0.400 parts by weight or less on a metal basis per 100 parts by weight of the metal oxide, the Bi content is 0.042 parts by weight or more and 0.850 parts by weight or less on a metal basis per 100 parts by weight of the metal oxide, and the Li content is 0.028 parts by weight or less (including 0 parts by weight) on a metal basis per 100 parts by weight of the metal oxide.

$$(Ba_{1-x}Ca_x)_a(Ti_{1-y-z}Sn_yZr_z)O_3 \qquad (1)$$

(wherein $0 \leq x \leq 0.080$, $0.013 \leq y \leq 0.060$, $0 \leq z \leq 0.040$, and $0.986 \leq a \leq 1.020$.)

26 Claims, 16 Drawing Sheets

(51) Int. Cl.
| | |
|---|---|
| *B41J 2/14* | (2006.01) |
| *C04B 35/468* | (2006.01) |
| *H01L 41/09* | (2006.01) |
| *H01L 41/187* | (2006.01) |
| *H02N 2/10* | (2006.01) |
| *H02N 2/16* | (2006.01) |
| *B06B 1/06* | (2006.01) |
| *G02B 27/00* | (2006.01) |
| *H01L 41/047* | (2006.01) |
| *H01L 41/083* | (2006.01) |
| *H02N 2/00* | (2006.01) |

(52) U.S. Cl.
CPC .............. *B41J 2/14* (2013.01); *C04B 35/4682* (2013.01); *G02B 27/0006* (2013.01); *H01L 41/0477* (2013.01); *H01L 41/083* (2013.01); *H01L 41/09* (2013.01); *H01L 41/1871* (2013.01); *H02N 2/001* (2013.01); *H02N 2/10* (2013.01); *H02N 2/16* (2013.01)

(56) References Cited

U.S. PATENT DOCUMENTS

| | | | |
|---|---|---|---|
| 8,714,712 B2 * | 5/2014 | Hamada | 347/68 |
| 2010/0096952 A1 | 4/2010 | Fukuoka | |
| 2010/0220427 A1 | 9/2010 | Symes | |
| 2011/0164331 A1 | 7/2011 | Sugiyama | |
| 2011/0298336 A1 | 12/2011 | Saito | |
| 2012/0033343 A1 | 2/2012 | Yoon et al. | |
| 2012/0038714 A1 | 2/2012 | Harigai | |
| 2013/0056671 A1 | 3/2013 | Kubota | |
| 2013/0106960 A1 | 5/2013 | Wang | |
| 2013/0270965 A1 | 10/2013 | Hayashi | |
| 2013/0278681 A1 | 10/2013 | Saito | |
| 2013/0328974 A1 | 12/2013 | Tanaka | |
| 2014/0042875 A1 | 2/2014 | Suenaga | |
| 2014/0152144 A1 | 6/2014 | Watanabe | |
| 2014/0265724 A1 | 9/2014 | Aida | |

FOREIGN PATENT DOCUMENTS

| | | |
|---|---|---|
| CN | 101935212 A | 1/2011 |
| CN | 101970374 A | 2/2011 |
| CN | 102531578 A | 7/2012 |
| CN | 102531593 A | 7/2012 |
| EP | 2749550 A2 | 7/2014 |
| JP | 4039029 B2 | 1/2008 |
| JP | 2009-215111 A | 9/2009 |
| JP | 2010-120835 A | 6/2010 |
| TW | 201432963 A | 8/2014 |
| WO | 2012/093646 A1 | 7/2012 |
| WO | 2012/105584 A1 | 8/2012 |
| WO | 2013/005700 A1 | 1/2013 |
| WO | 2013/005701 A1 | 1/2013 |
| WO | 2013/005702 A1 | 1/2013 |

OTHER PUBLICATIONS

Yoon, M.-S., et al., "Effects of A-site Ca and B-site Zr substitution on dielectric properties and microstructure in tin-doped BaTiO3—CaTiO3 composites", Ceramics International, 2008, pp. 1941-1948, 34.

Prakash, Rahul, "Synthesis_Characterization and Effect of Atmosphere on Sintering Behavior of BaTiO3 Nano-Powders", Department of Ceramic Engineering National Institute of Technology Rourkela 2011.

* cited by examiner

IN-PHASE

ANTI-PHASE

PIEZOELECTRIC MATERIAL, PIEZOELECTRIC ELEMENT, AND ELECTRONIC EQUIPMENT

BACKGROUND OF THE INVENTION

1. Field of the Invention

The present invention relates to a piezoelectric material and more particularly to a lead-free piezoelectric material. The present invention also relates to a piezoelectric element, a multilayered piezoelectric element, a liquid discharge head, a liquid discharge apparatus, an ultrasonic motor, an optical apparatus, a vibratory apparatus, a dust removing device, an image pickup apparatus, and electronic equipment, each including the piezoelectric material.

2. Description of the Related Art

In general, piezoelectric materials are $ABO_3$ perovskite-type metal oxides, such as lead zirconate titanate (hereinafter referred to as "PZT"). However, PZT contains lead as an A site element, and its effect on the environment is regarded as a problem. Thus, there is a demand for piezoelectric materials of lead-free perovskite-type metal oxides.

One known piezoelectric material of a lead-free perovskite-type metal oxide is barium titanate. In order to improve the characteristics of barium titanate, materials based on barium titanate are being developed.

Japanese Patent No. 4039029 discloses a piezoelectric material in which part of the A site of barium titanate is replaced by Ca in order to reduce the temperature dependence of the piezoelectric property of the barium titanate. Japanese Patent Laid-Open No. 2010-120835 discloses a piezoelectric material in which Mn, Fe, or Cu is added to a material prepared by replacing part of the A site of barium titanate by Ca in order to improve the mechanical quality factor of the barium titanate.

However, such known piezoelectric materials have a low piezoelectric constant in a high temperature region and a low mechanical quality factor in a low temperature region in a device operation temperature range (−30° C. to 50° C.). The present invention addresses these problems and provides a lead-free piezoelectric material having a high piezoelectric constant and a high mechanical quality factor in a device operation temperature range. A piezoelectric material according to the present invention contains Sn and Bi and thereby has a high mechanical quality factor particularly at low temperatures.

The present invention also provides a piezoelectric element, a multilayered piezoelectric element, a liquid discharge head, a liquid discharge apparatus, an ultrasonic motor, an optical apparatus, a vibratory apparatus, a dust removing device, an image pickup apparatus, and electronic equipment, each including the piezoelectric material.

SUMMARY OF THE INVENTION

A piezoelectric material according to one aspect of the present invention contains a main component containing a perovskite-type metal oxide represented by the following general formula (1); a first auxiliary component composed of Mn; and a second auxiliary component composed of Bi or Bi and Li, wherein the Mn content is 0.040 parts by weight or more and 0.400 parts by weight or less on a metal basis per 100 parts by weight of the metal oxide, the Bi content is 0.042 parts by weight or more and 0.850 parts by weight or less on a metal basis per 100 parts by weight of the metal oxide, and the Li content is 0.028 parts by weight or less (including 0 parts by weight) on a metal basis per 100 parts by weight of the metal oxide.

$$(Ba_{1-x}Ca_x)_a(Ti_{1-y-z}Sn_yZr_z)O_3 \quad (1)$$

(wherein x is in the range of $0 \leq x \leq 0.080$, y is in the range of $0.013 \leq y \leq 0.060$, z is in the range of $0 \leq z \leq 0.040$, and a is in the range of $0.986 \leq a \leq 1.020$.)

A piezoelectric element according to one aspect of the present invention includes a first electrode, a piezoelectric material portion, and a second electrode, wherein the piezoelectric material portion includes the piezoelectric material.

A multilayered piezoelectric element according to one aspect of the present invention includes piezoelectric material layers and electrode layers alternately stacked on top of one another. The electrode layers include an internal electrode. The piezoelectric material layers are formed of the piezoelectric material.

A liquid discharge head according to one aspect of the present invention includes a liquid chamber and an orifice for discharging in communication with the liquid chamber. The liquid chamber has a vibrating portion that includes the piezoelectric element or the multilayered piezoelectric element.

A liquid discharge apparatus according to one aspect of the present invention includes a stage configured to receive an object and the liquid discharge head.

An ultrasonic motor according to one aspect of the present invention includes a vibrating member and a moving body in contact with the vibrating member. The vibrating member includes the piezoelectric element or the multilayered piezoelectric element.

An optical apparatus according to one aspect of the present invention includes a drive unit that includes the ultrasonic motor.

A vibratory apparatus according to one aspect of the present invention includes a vibrating member that includes the piezoelectric element or the multilayered piezoelectric element on a diaphragm.

A dust removing device according to one aspect of the present invention includes the vibratory apparatus in a vibrating portion.

An image pickup apparatus according to one aspect of the present invention includes the dust removing device and an image pickup element unit, wherein the dust removing device includes a diaphragm on a light-receiving surface side of the image pickup element unit.

Electronic equipment according to one aspect of the present invention includes a piezoelectric acoustic component that includes the piezoelectric element or the multilayered piezoelectric element.

Further features of the present invention will become apparent from the following description of exemplary embodiments with reference to the attached drawings.

The present invention provides a lead-free piezoelectric material having a high piezoelectric constant and a high mechanical quality factor in a device operation temperature range (−30° C. to 50° C.). In particular, the present invention provides a piezoelectric material having a high mechanical quality factor at low temperatures.

The present invention also provides a piezoelectric element, a multilayered piezoelectric element, a liquid discharge head, a liquid discharge apparatus, an ultrasonic motor, an optical apparatus, a vibratory apparatus, a dust removing device, an image pickup apparatus, and electronic equipment, each including the piezoelectric material.

DESCRIPTION OF THE EMBODIMENTS

Figure 1:
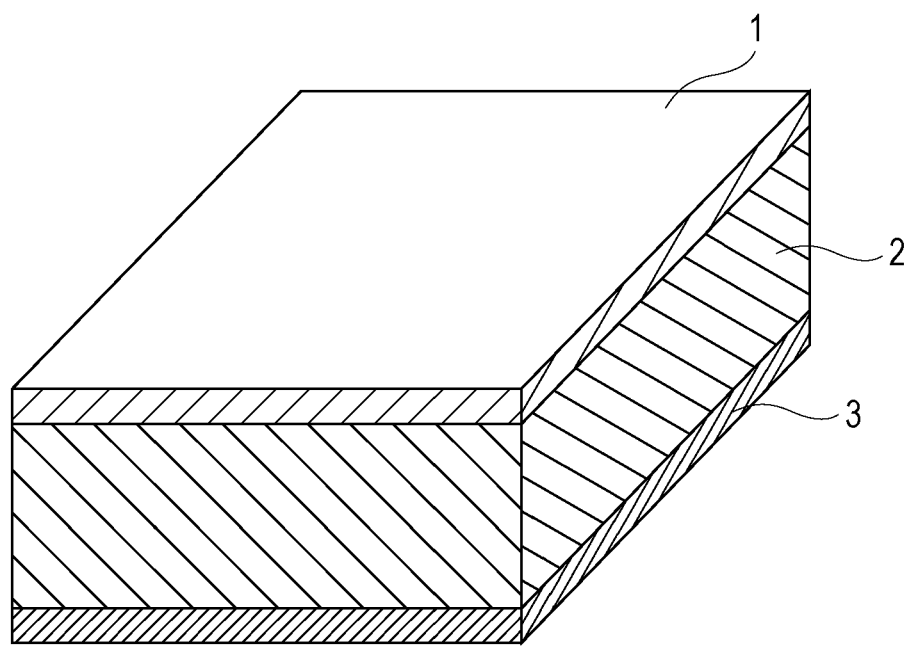
FIG. 1 is a schematic view of a piezoelectric element according to an embodiment of the present invention.

Embodiments of the present invention will be described below.

A piezoelectric material according to an embodiment of the present invention contains a main component containing a perovskite-type metal oxide represented by the following general formula (1); a first auxiliary component composed of Mn; and a second auxiliary component composed of Bi or Bi and Li, wherein the Mn content is 0.040 parts by weight or more and 0.400 parts by weight or less on a metal basis per 100 parts by weight of the metal oxide, the Bi content is 0.042 parts by weight or more and 0.850 parts by weight or less on a metal basis per 100 parts by weight of the metal oxide, and the Li content is 0.028 parts by weight or less (including 0 parts by weight) on a metal basis per 100 parts by weight of the metal oxide.

$(Ba_{1-x}Ca_x)_a(Ti_{1-y-z}Sn_yZr_z)O_3$ (1)

(wherein x is in the range of $0 \leq x \leq 0.080$, y is in the range of $0.013 \leq y \leq 0.060$, z is in the range of $0 \leq z \leq 0.040$, and a is in the range of $0.986 \leq a \leq 1.020$.)

The auxiliary component content, such as the Mn content, the Bi content, or the Li content, "on a metal basis" is defined as described below. For example, the Mn content refers to the weight of Mn per 100 parts by weight of the constituent elements of the metal oxide represented by the general formula (1) on an oxide basis. The weight of each constituent element of the metal oxide on an oxide basis is calculated from the Ba, Ca, Ti, Sn, Zr, Mn, Bi, and Li contents of the piezoelectric material, for example, measured using X-ray fluorescence (XRF) spectroscopy, ICP spectroscopy, or atomic absorption spectrometry.

Perovskite-Type Metal Oxide

The term "perovskite-type metal oxide", as used herein, refers to a metal oxide having a perovskite-type structure, which is ideally a cubic structure, as described in Iwanami Rikagaku Jiten, 5th edition (Iwanami Shoten, published on Feb. 20, 1998). A metal oxide having a perovskite-type structure is generally represented by the chemical formula $ABO_3$. In a perovskite-type metal oxide, elements A and B in the form of ions occupy particular positions of a unit cell referred to as the A site and the B site, respectively. In a cubic unit cell, the element A occupies the vertexes of the cube, and the element B occupies the body-centered position of the cube. The element O in the form of an oxygen anion occupies the face-centered positions of the cube.

In the metal oxide represented by the general formula (1), the metallic elements at the A site are Ba and Ca, and the metallic elements at the B site are Ti, Zr, and Sn. Ba and Ca may partly occupy the B site. Likewise, Ti and Zr may partly occupy the A site. However, Sn should not occupy the A site because this impairs the piezoelectric property.

Although the molar ratio of the B site element to the element O is 1:3 in the general formula (1), small variations in the molar ratio are within the scope of the present invention, provided that the metal oxide has the perovskite-type structure as the primary phase.

The perovskite-type structure of the metal oxide can be determined by structural analysis using X-ray diffraction or electron diffraction.

Main Component of Piezoelectric Material

In a piezoelectric material according to an embodiment of the present invention, the value a of the general formula (1), which represents the ratio of the number of moles of Ba and Ca at the A site to the number of moles of Ti, Zr, and Sn at the B site, is in the range of $0.986 \leq a \leq 1.020$. A value a of less than 0.986 tends to result in abnormal grain growth in the piezoelectric material and a decrease in the mechanical strength of the piezoelectric material. A value a of more than 1.020 results in an excessively high grain growth temperature, making sintering of the metal oxide impossible in ordinary furnaces. The phrase "making sintering of the metal oxide impossible" means that the piezoelectric material has a low density or contains many pores and lattice defects.

The value y of the general formula (1), which represents the mole ratio of Sn at the B site, is in the range of $0.013 \leq y \leq 0.060$. A piezoelectric material according to an embodiment of the present invention has decreased tetragonal crystallinity because Sn having a smaller ionic radius than Ti is disposed at the B site. This results in a small c/a close to 1 and a satisfactory piezoelectric property. A value y of less than 0.013 results in a poor piezoelectric property. A value y of more than 0.060 results in a low Curie temperature and insufficient high-temperature durability. In order to improve the piezoelectric property in a device operation temperature range (−30° C. to 50° C.), the value y can be in the range of $0.021 \leq y \leq 0.038$.

The term "Curie temperature (Tc)", as used herein, refers to a temperature at which the ferroelectricity of a material is lost. In general, the piezoelectric property of a piezoelectric material is also lost at the Curie temperature (Tc) or higher. The Curie temperature (Tc) may be determined by directly measuring the temperature at which ferroelectricity is lost or measuring the temperature at which the relative dielectric constant reaches its maximum in a very small alternating electric field.

The value z of the general formula (1), which represents the mole ratio of Zr at the B site, is in the range of $0 \leq z \leq 0.040$. A value z of more than 0.040 results in a low mechanical quality factor.

The value z of the general formula (1), which represents the mole ratio of Zr at the B site, can be zero. A value z of zero can result in a higher mechanical quality factor in the device operation temperature range.

The value x of the general formula (1), which represents the mole ratio of Ca at the A site, is in the range of $0 \leq x \leq 0.080$. A value x of more than 0.080 results in a poor piezoelectric property in the device operation temperature range. In order to improve the mechanical quality factor, the value x can be $0.020 \leq x \leq 0.080$. In order to further improve the piezoelectric property and the mechanical quality factor, the value x can be $0.030 \leq x \leq 0.080$.

First Auxiliary Component of Piezoelectric Material

The first auxiliary component is Mn. The Mn content is 0.040 parts by weight or more and 0.400 parts by weight or less on a metal basis per 100 parts by weight of the perovskite-type metal oxide. A piezoelectric material according to an embodiment of the present invention having the Mn content in this range has an improved mechanical quality factor without a reduction in the piezoelectric constant. The term "mechanical quality factor" refers to a coefficient that represents elastic loss resulting from vibration in the evaluation of a piezoelectric material as an oscillator. The mechanical quality factor is observed as the sharpness of a resonance curve in impedance measurement. Thus, the mechanical quality factor is a coefficient that represents the sharpness of resonance of an oscillator. Energy loss due to vibration decreases with increasing mechanical quality factor. When the piezoelectric material is driven as a piezoelectric element by the application of a voltage, an improvement in insulation property or mechanical quality factor ensures long-term reliability of the piezoelectric element.

A Mn content of less than 0.040 parts by weight results in a mechanical quality factor as low as less than 400. A piezoelectric element composed of the piezoelectric material having a low mechanical quality factor and a pair of electrodes consumes more power when driven as a resonance device. The mechanical quality factor is preferably 400 or more, more preferably 500 or more, still more preferably 600 or more. In this range, the power consumption is not significantly increased in device operation. A Mn content of more than 0.400 parts by weight unfavorably results in a poor piezoelectric property.

Mn is not limited to metal Mn and may be contained in the piezoelectric material as a Mn component of any form. For example, Mn may be dissolved in the B site or may be contained in boundaries between crystal grains (hereinafter referred to as grain boundaries). A Mn component may be contained in the piezoelectric material in the form of metal, ion, oxide, metal salt, or complex.

Mn can be mostly disposed at the B site. Mn can have a valence of 4+. In general, Mn can have a valence of 4+, 2+, or 3+. In the presence of conduction electrons in crystals (for example, in the presence of oxygen vacancies in crystals or in the presence of donor elements occupying the A site), Mn having a valence of 4+ can trap the conduction electrons and improve insulation resistance by reducing its valence to 3+ or 2+. In terms of the ionic radius, Mn having a valence of 4+ can easily substitute for the main component Ti of the B site.

Mn having a valence of less than 4+, such as 2+, acts as an acceptor. The presence of Mn as an acceptor in perovskite crystals results in the formation of holes or oxygen vacancies in the crystals.

In the presence of a large amount of Mn having a valence of 2+ or 3+, holes cannot be compensated for with oxygen vacancies alone, and the insulation resistance decreases. Thus, Mn can mostly have a valence of 4+. A minor proportion of Mn may have a valence of less than 4+ and occupy the B site of the perovskite structure as an acceptor and form oxygen vacancies. Mn having a valence of 2+ or 3+ and oxygen vacancies can form defect dipoles and thereby improve the mechanical quality factor of the piezoelectric material.

Second Auxiliary Component of Piezoelectric Material

The second auxiliary component is composed of Bi or Bi and Li. The Bi content is 0.042 parts by weight or more and 0.850 parts by weight or less on a metal basis per 100 parts by weight of the metal oxide. The Li content is 0.028 parts by weight or less (including 0 parts by weight) on a metal basis per 100 parts by weight of the metal oxide.

A piezoelectric material according to an embodiment of the present invention containing Bi or Bi and Li in this range has a significantly improved mechanical quality factor without a reduction in the piezoelectric constant at low temperatures. It is believed that trivalent Bi is mostly disposed at the A site and is partly disposed at the B site or crystal grain boundaries. A piezoelectric material containing Bi at the A site can have a high mechanical quality factor even when the piezoelectric material has an orthorhombic crystal structure. When a piezoelectric material contains Bi at the B site and has a tetragonal crystal structure, Bi has a different valence from Ti, Zr, or Sn (mostly tetravalent) and can induce a defect dipole and an internal electric field. Thus, a piezoelectric material having either an orthorhombic or tetragonal crystal structure can have a high mechanical quality factor. A piezoelectric material according to an embodiment of the present invention containing a proper amount of Bi can have a high mechanical quality factor in the device operation temperature range. A Bi content of less than 0.042 parts by weight unfavorably results in a mechanical quality factor of less than 400 at low temperatures (for example, $-30°$ C.). A Bi content of more than 0.850 parts by weight unfavorably results in a poor piezoelectric property. In order to improve the mechanical quality factor and the piezoelectric constant in a device operation temperature range ($-30°$ C. to $50°$ C.), the Bi content is preferably 0.100 parts by weight or more and 0.850 parts by weight or less, more preferably 0.100 parts by weight or more and 0.480 parts by weight or less. A Li content of more than 0.028 parts by weight unfavorably results in a poor piezoelectric property. A piezoelectric material having a Li content of 0.028 parts by weight or less can be sintered at a lower temperature than a piezoelectric material containing no Li without impairment of the piezoelectric property.

Bi is not limited to metal Bi and may be contained in the piezoelectric material as a Bi component of any form. For example, Bi may be dissolved in the A site or the B site or may be contained in grain boundaries. A Bi component may be contained in the piezoelectric material in the form of metal, ion, oxide, metal salt, or complex.

In order to improve the mechanical quality factor at low temperatures, Bi can be dissolved in the A site as trivalent Bi. The valence of Bi can be determined in an X-ray absorption fine structure (XAFS) measurement using synchrotron radiation.

Li is not limited to metal Li and may be contained in the piezoelectric material as a Li component of any form. For example, Li may be dissolved in the A site or the B site or may be contained in grain boundaries. A Li component may be contained in the piezoelectric material in the form of metal, ion, oxide, metal salt, or complex.

Third Auxiliary Component of Piezoelectric Material

A piezoelectric material according to an embodiment of the present invention further contains a third auxiliary component containing at least one of Si and B, wherein the third auxiliary component content is preferably 0.001 parts by weight or more and 4.000 parts by weight or less, more preferably 0.003 parts by weight or more and 2.000 parts by weight or less, on a metal basis per 100 parts by weight of the perovskite-type metal oxide represented by the general formula (1).

The third auxiliary component content refers to the weight of the third auxiliary component per 100 parts by weight of the constituent elements of the metal oxide represented by the general formula (1) on an oxide basis. The weight of each constituent element of the metal oxide on an oxide basis is calculated from the metal contents of the piezoelectric material, for example, measured using X-ray fluorescence (XRF) spectroscopy, ICP spectroscopy, or atomic absorption spectrometry.

The third auxiliary component contains at least one of Si and B. B and Si segregate at grain boundaries of the piezoelectric material. This reduces a leakage current flowing through the grain boundaries and increases resistivity. A piezoelectric material containing 0.001 parts by weight or more of the third auxiliary component advantageously has high resistivity and an improved insulation property. A piezoelectric material containing more than 4.000 parts by weight of the third auxiliary component unfavorably has a low dielectric constant and a poor piezoelectric property. The Si content may be 0.003 parts by weight or more and 1.000 parts by weight or less per 100 parts by weight of the perovskite-type metal oxide. The B content may be 0.001 parts by weight or more and 1.000 parts by weight or less.

The composition of a piezoelectric material according to an embodiment of the present invention may be determined using any method, such as X-ray fluorescence analysis, ICP spectroscopy, or atomic absorption spectrometry. Li can be accurately measured using ICP spectroscopy.

A multilayered piezoelectric element includes a thin piezoelectric material between electrodes and therefore requires durability in a high electric field. Because of its excellent insulation property, a piezoelectric material according to an embodiment of the present invention is suitable for a multilayered piezoelectric element.

A piezoelectric material according to an embodiment of the present invention may contain Nb inevitably contained in a commercially available raw material for Ti and Hf inevitably contained in a commercially available raw material for Zr.

The perovskite-type metal oxide represented by the general formula (1), the first auxiliary component, the second auxiliary component, and the third auxiliary component can constitute 98.5 mol % or more of a piezoelectric material according to an embodiment of the present invention. The perovskite-type metal oxide represented by the general formula (1) preferably constitutes 90 mol % or more, more preferably 95 mol % or more, of the piezoelectric material.

Crystal Grain Size and Equivalent Circular Diameter

The average equivalent circular diameter of crystal grains of a piezoelectric material according to an embodiment of the present invention is preferably 0.5 μm or more and 10 μm or less. The average equivalent circular diameter refers to the average value of the equivalent circular diameters of crystal grains. Having an average equivalent circular diameter of crystal grains in this range, a piezoelectric material according to an embodiment of the present invention can have a satisfactory piezoelectric property and satisfactory mechanical strength. An average equivalent circular diameter of less than 0.5 μm may result in a poor piezoelectric property. An average equivalent circular diameter of more than 10 μm may result in reduced mechanical strength. The average equivalent circular diameter is more preferably 0.5 μm or more and 4.5 μm or less.

The term "equivalent circular diameter", as used herein, refers to a "projected area equivalent circular diameter" generally referred to in microscopy and refers to the diameter of a perfect circle having the same area as the projected area of a crystal grain. In the present invention, the equivalent circular diameter may be determined using any method. For example, the grain size may be determined by processing an image of a surface of the piezoelectric material taken with a polarizing microscope or a scanning electron microscope. Since the optimum magnification depends on the grain size to be measured, an optical microscope or an electron microscope may be selected according to the grain size. The equivalent circular diameter may be determined from an image of a polished surface or a cross section rather than the surface of the material.

Relative Density

A piezoelectric material according to an embodiment of the present invention preferably has a relative density of 93% or more and 100% or less.

The term "relative density", as used herein, refers to the ratio of a measured density to a theoretical density. The theoretical density is calculated from the lattice constant of a piezoelectric material and the atomic weights of the constituent elements of the piezoelectric material. The lattice constant can be measured through X-ray diffraction analysis. The density can be measured in accordance with Archimedes' principle.

A relative density of less than 93% may result in a poor piezoelectric property, a low mechanical quality factor, or low mechanical strength.

A piezoelectric material according to an embodiment of the present invention more preferably has a relative density of 95% or more and 100% or less, still more preferably 97% or more and 100% or less.

Method for Producing Piezoelectric Material

A method for producing a piezoelectric material according to an embodiment of the present invention is not particularly limited. A typical production method will be described below.

Raw Materials of Piezoelectric Material

A piezoelectric material can be produced using a common method by forming a compact from an oxide, carbonate, nitrate, or oxalate solid powder containing the constituent elements of the piezoelectric material and sintering the compact at atmospheric pressure. The raw materials include a metallic compound, such as a Ba compound, a Ca compound, a Ti compound, a Sn compound, a Zr compound, a Mn compound, a Bi compound, a Li compound, a B compound, and/or a Si compound.

Examples of the Ba compound include, but are not limited to, barium oxide, barium carbonate, barium oxalate, barium acetate, barium nitrate, barium titanate, barium zirconate, barium stannate, and barium zirconate titanate. The Ba compound can be of a commercially available high purity type (for example, a purity of 99.99% or more).

Examples of the Ca compound include, but are not limited to, calcium oxide, calcium carbonate, calcium oxalate, calcium acetate, calcium titanate, calcium zirconate, and calcium stannate. The Ca compound can be of a commercially available high purity type (for example, a purity of 99.99% or more).

Examples of the Ti compound include, but are not limited to, titanium oxide, barium titanate, barium zirconate titanate, and calcium titanate. In the case that the Ti compound contains an alkaline-earth metal, such as barium or calcium, a commercially available compound of a high purity type (for example, a purity of 99.99% or more) can be used.

Examples of the Zr compound include, but are not limited to, zirconium oxide, barium zirconate, barium zirconate titanate, and calcium zirconate. In the case that the Zr compound contains an alkaline-earth metal, such as barium or calcium, a commercially available compound of a high purity type (for example, a purity of 99.99% or more) can be used.

Examples of the Sn compound include, but are not limited to, tin oxide, barium stannate, barium stannate titanate, and calcium stannate. In the case that the Sn compound contains an alkaline-earth metal, such as barium or calcium, a commercially available compound of a high purity type (for example, a purity of 99.99% or more) can be used.

Examples of the Mn compound include, but are not limited to, manganese carbonate, manganese oxide, manganese dioxide, manganese acetate, and trimanganese tetroxide.

Examples of the Bi compound include, but are not limited to, bismuth oxide and lithium bismuthate.

Examples of the Li compound include, but are not limited to, lithium carbonate and lithium bismuthate.

Examples of the Si compound include, but are not limited to, silicon oxide.

Examples of the B compound include, but are not limited to, boron oxide.

A raw material for controlling the ratio a of the number of moles of Ba and Ca at the A site to the number of moles of Ti, Sn, and Zr at the B site of a piezoelectric material according to an embodiment of the present invention is not particularly limited. A Ba compound, a Ca compound, a Ti compound, a Sn compound, and a Zr compound have the same effect.

Granulated Powder and Compact

The term "compact", as used herein, refers to a solid body formed of a solid powder. The compact can be formed by uniaxial pressing, cold hydrostatic pressing, hot hydrostatic pressing, casting, or extrusion molding. The compact can be formed of a granulated powder. Sintering of the compact formed of a granulated powder has an advantage that the grain size distribution of the sintered body tends to become uniform. In order to improve the insulation property of the sintered body, the compact can contain a third auxiliary component containing at least one of Si and B.

The raw material powder of a piezoelectric material may be granulated using any method. Spray drying can make the particle size of the granulated powder more uniform.

A binder for use in granulation may be polyvinyl alcohol (PVA), polyvinyl butyral (PVB), or an acrylic resin. The amount of binder is preferably in the range of 1 to 10 parts by weight per 100 parts by weight of the raw material powder of the piezoelectric material, more preferably 2 to 5 parts by weight in order to increase the compact density.

Sintering

The compact may be sintered using any method.

Examples of the sintering method include, but are not limited to, sintering in an electric furnace, sintering in a gas furnace, electric heating, microwave sintering, millimeter-wave sintering, and hot isostatic pressing (HIP). Sintering in an electric furnace or a gas furnace may be performed in a continuous furnace or a batch furnace.

The sintering temperature in the sintering method is not particularly limited and may be a temperature at which the compounds can react to sufficiently grow crystals. The sintering temperature is preferably 1100° C. or more and 1400° C. or less, more preferably 1100° C. or more and 1350° C. or less, such that the particle size of the piezoelectric material is in the range of 0.5 to 10 μm. A piezoelectric material sintered in the temperature range has satisfactory piezoelectric performance. In order to ensure the reproducibility and stability of the characteristics of a piezoelectric material produced by sintering, sintering can be performed at a constant temperature within the range described above for 2 hours or more and 48 hours or less. Although two-step sintering may also be performed, a sintering method without an abrupt temperature change can improve productivity.

A piezoelectric material produced by sintering can be polished and then heat-treated at a temperature of 1000° C. or more. Heat treatment of the piezoelectric material at a temperature of 1000° C. or more can relieve the residual stress of the piezoelectric material resulting from mechanical polishing and thereby improves the piezoelectric property of the piezoelectric material. Heat treatment of the piezoelectric material can also remove the raw material powder, such as barium carbonate, precipitated at grain boundaries. The heat-treatment time can be, but is not limited to, one hour or more.

Piezoelectric Element

FIG. 1 is a schematic view of a piezoelectric element according to an embodiment of the present invention. The piezoelectric element includes a first electrode 1, a piezoelectric material portion 2, and a second electrode 3. The piezoelectric material of the piezoelectric material portion 2 is a piezoelectric material according to an embodiment of the present invention.

The piezoelectric property of the piezoelectric material can be evaluated by at least attaching the first electrode 1 and the second electrode 3 to the piezoelectric material portion 2 to form the piezoelectric element. Each of the first electrode 1 and the second electrode 3 is formed of a conductive layer having a thickness in the range of approximately 5 nm to 10 μm. The material of each of the first electrode 1 and the second electrode 3 is not particularly limited and may be any material that is commonly used for piezoelectric elements. Examples of such a material include, but are not limited to, metals, such as Ti, Pt, Ta, Ir, Sr, In, Sn, Au, Al, Fe, Cr, Ni, Pd, Ag, and Cu, and compounds thereof.

Each of the first electrode 1 and the second electrode 3 may be made of one of these materials or may be a multilayer made of two or more of the materials. The material of the first electrode 1 may be different from the material of the second electrode 3.

The first electrode 1 and the second electrode 3 may be manufactured using any method, for example, by baking a metal paste or using a sputtering process or a vapor deposition method. The first electrode 1 and the second electrode 3 may have a desired pattern.

Polarization Treatment

The piezoelectric element can have a unidirectional polarization axis. Having the unidirectional polarization axis can increase the piezoelectric constant of the piezoelectric element.

The piezoelectric element may be polarized using any method. The piezoelectric element may be polarized in the ambient atmosphere or in a silicone oil. The polarization temperature can be in the range of 60° C. to 150° C. The optimum conditions for polarization may vary with the composition of the piezoelectric material of the piezoelectric element. The electric field applied in polarization treatment can be in the range of 600 V/mm to 2.0 kV/mm.

Measurement of Piezoelectric Constant and Mechanical Quality Factor

The piezoelectric constant and the mechanical quality factor of the piezoelectric element can be calculated from the resonance frequency and the antiresonant frequency measured with a commercially available impedance analyzer in accordance with a standard of Japan Electronics and Information Technology Industries Association (JEITA EM-4501). This method is hereinafter referred to as a resonance-antiresonance method.

Multilayered Piezoelectric Element

A multilayered piezoelectric element according to an embodiment of the present invention will be described below.

A multilayered piezoelectric element according to an embodiment of the present invention includes piezoelectric material layers and electrode layers alternately stacked on top of one another. The electrode layers include an internal electrode. The piezoelectric material layers are formed of a piezoelectric material according to an embodiment of the present invention.

Figure 2A:
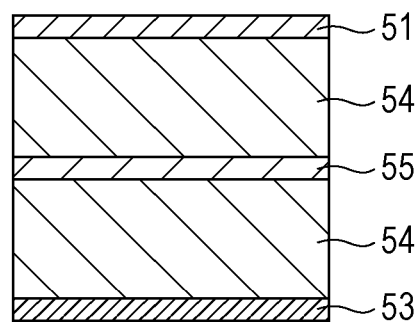
FIGS. 2A and 2B are schematic cross-sectional views of a multilayered piezoelectric element according to an embodiment of the present invention.
Figure 2B:
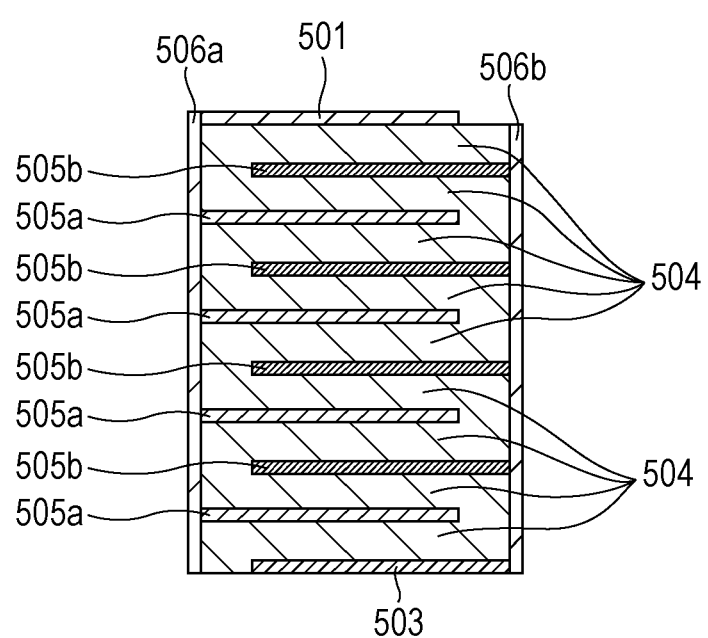

FIGS. 2A and 2B are schematic cross-sectional views of a multilayered piezoelectric element according to an embodiment of the present invention. A multilayered piezoelectric element according to an embodiment of the present invention includes the piezoelectric material layers 54 and electrode layers alternately stacked on top of one another. The electrode layers include an internal electrode 55. The piezoelectric material layers 54 are formed of the piezoelectric material described above. The electrode layers may include external electrodes, such as a first electrode 51 and a second electrode 53, in addition to the internal electrode 55.

The multilayered piezoelectric element illustrated in FIG. 2A includes two piezoelectric material layers 54 and one internal electrode 55 interposed therebetween, and the layered body is disposed between the first electrode 51 and the second electrode 53. The number of piezoelectric material layers and the number of internal electrodes are not particularly limited and may be increased, as illustrated in FIG. 2B. The multilayered piezoelectric element illustrated in FIG. 2B includes nine piezoelectric material layers 504 and eight internal electrodes 505 (505a and 505b) alternately stacked on top of one another, and the layered body is disposed between a first electrode 501 and a second electrode 503. The multilayered piezoelectric element further includes an external electrode 506a and an external electrode 506b for connecting the internal electrodes 505 to each other.

The size and shape of the internal electrodes 55 and 505 and the external electrodes 506a and 506b may be different from the size and shape of the piezoelectric material layers 54 and 504. Each of the internal electrodes 55 and 505 and the external electrodes 506a and 506b may be composed of a plurality of portions.

Each of the internal electrodes 55 and 505, the external electrodes 506a and 506b, the first electrodes 51 and 501, and the second electrodes 53 and 503 is formed of a conductive layer having a thickness in the range of approximately 5 nm to 10 μm. The material of each of these electrodes is not particularly limited and may be any material that is commonly used for piezoelectric elements. Examples of such a material include, but are not limited to, metals, such as Ti, Pt, Ta, Ir, Sr, In, Sn, Au, Al, Fe, Cr, Ni, Pd, Ag, and Cu, and compounds thereof. Each of the internal electrodes 55 and 505 and the external electrodes 506a and 506b may be made of one of these materials or a mixture or an alloy thereof or may be a multilayer film made of two or more of the materials. These electrodes may be made of different materials.

The internal electrodes 55 and 505 may contain Ag and Pd. The weight ratio M1/M2 of the weight M1 of Ag to the weight M2 of Pd is preferably in the range of $0.25 \leq M1/M2 \leq 4.0$, more preferably $2.3 \leq M1/M2 \leq 4.0$. A weight ratio M1/M2 of less than 0.25 is undesirable because of a high sintering temperature of the internal electrodes. A weight ratio M1/M2 of more than 4.0 is also undesirable because the internal electrode has an island structure and a heterogeneous surface.

The internal electrodes 55 and 505 may contain at least one of Ni and Cu, which are inexpensive electrode materials. When the internal electrodes 55 and 505 contain at least one of Ni and Cu, the multilayered piezoelectric element can be baked in a reducing atmosphere.

As illustrated in FIG. 2B, the plurality of electrodes including the internal electrodes 505 may be connected to each other in order to synchronize the driving voltage phases. For example, the internal electrodes 505a may be connected to the first electrode 501 through the external electrode 506a. The internal electrodes 505b may be connected to the second electrode 503 through the external electrode 506b. The internal electrodes 505a and the internal electrodes 505b may be alternately disposed. The electrodes may be connected using any method. For example, an electrode or a conductor line for connection may be disposed on a side surface of the multilayered piezoelectric element. Alternatively, a through-hole passing through the piezoelectric material layers 504 may be formed, and the inside of the through-hole may be coated with a conductive material to connect the electrodes.

Liquid Discharge Head

A liquid discharge head according to an embodiment of the present invention will be described below.

A liquid discharge head according to an embodiment of the present invention includes a liquid chamber and an orifice for discharging in communication with the liquid chamber. The liquid chamber includes a vibrating portion that includes a piezoelectric element or a multilayered piezoelectric element according to an embodiment of the present invention.

Figure 3A:
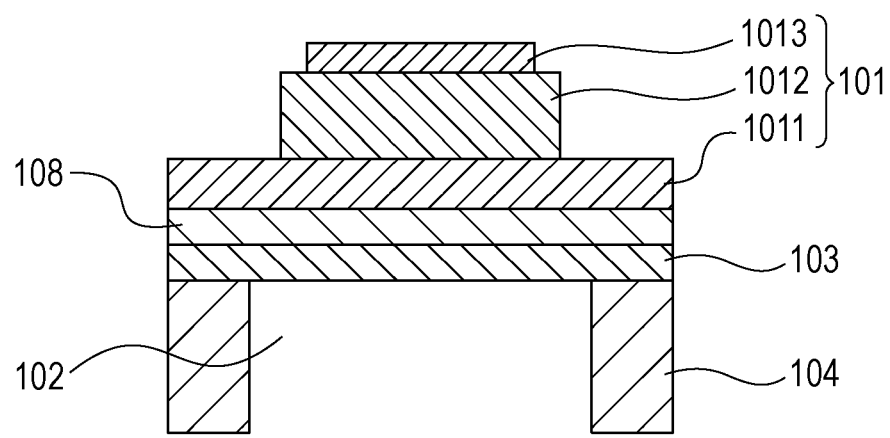
FIGS. 3A and 3B are schematic views of a liquid discharge head according to an embodiment of the present invention.
Figure 3B:
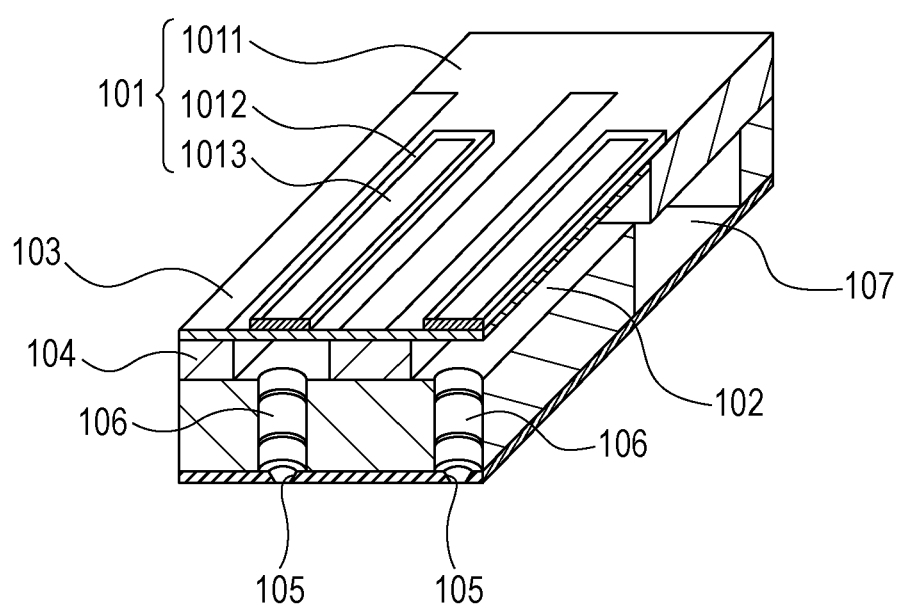

FIGS. 3A and 3B are schematic views of a liquid discharge head according to an embodiment of the present invention. As illustrated in FIGS. 3A and 3B, the liquid discharge head includes a piezoelectric element 101 according to an embodiment of the present invention. The piezoelectric element 101 includes a first electrode 1011, a piezoelectric material 1012, and a second electrode 1013. The piezoelectric material 1012 may be patterned, as illustrated in FIG. 3B.

FIG. 3B is a schematic view of the liquid discharge head. The liquid discharge head includes an orifice for discharging 105, an individual liquid chamber 102, a communicating hole 106 that connects the individual liquid chamber 102 to the orifice for discharging 105, a liquid chamber partition wall 104, a common liquid chamber 107, a diaphragm 103, and the piezoelectric element 101. Although the piezoelectric element 101 is rectangular in FIG. 3B, the piezoelectric element 101 may be of another shape, such as elliptical, circular, or parallelogrammic. In general, the piezoelectric material 1012 has a shape corresponding to the shape of the individual liquid chamber 102.

The piezoelectric element 101 of the liquid discharge head will be described in detail below with reference to FIG. 3A. FIG. 3A is a cross-sectional view of FIG. 3B in the width direction of the piezoelectric element. Although the piezoelectric element 101 has a rectangular cross section in FIG. 3A, the piezoelectric element 101 may have a trapezoidal or inverted trapezoidal cross section.

In FIG. 3A, the first electrode 1011 is a lower electrode, and the second electrode 1013 is an upper electrode. The first electrode 1011 and the second electrode 1013 may be arranged differently. For example, the first electrode 1011 may be a lower electrode or an upper electrode. Likewise, the second electrode 1013 may be an upper electrode or a lower electrode. A buffer layer 108 may be disposed between the diaphragm 103 and the lower electrode. These different designations result from variations in the method for manufacturing the device, and each of the cases has the advantages of the present invention.

In the liquid discharge head, the diaphragm 103 bends upward and downward with the expansion and contraction of the piezoelectric material 1012, thereby applying pressure to a liquid in the individual liquid chamber 102. This allows the liquid to be discharged from the orifice for discharging 105. A liquid discharge head according to an embodiment of the present invention can be used in printers and in the manufacture of electronic equipment.

The diaphragm 103 has a thickness of 1.0 μm or more and 15 μm or less, preferably 1.5 μm or more and 8 μm or less. The material of the diaphragm is not particularly limited and can be Si. Si of the diaphragm may be doped with boron or phosphorus. The buffer layer and the electrode on the diaphragm may constitute the diaphragm. The buffer layer 108 has a thickness of 5 nm or more and 300 nm or less, preferably 10 nm or more and 200 nm or less. The orifice for discharging 105 has an equivalent circular diameter of 5 μm or more and 40 μm or less. The orifice for discharging 105 may be circular, star-shaped, square, or triangular.

Liquid Discharge Apparatus

A liquid discharge apparatus according to an embodiment of the present invention will be described below. The liquid discharge apparatus includes a stage configured to receive an object and the liquid discharge head.

Figure 4:
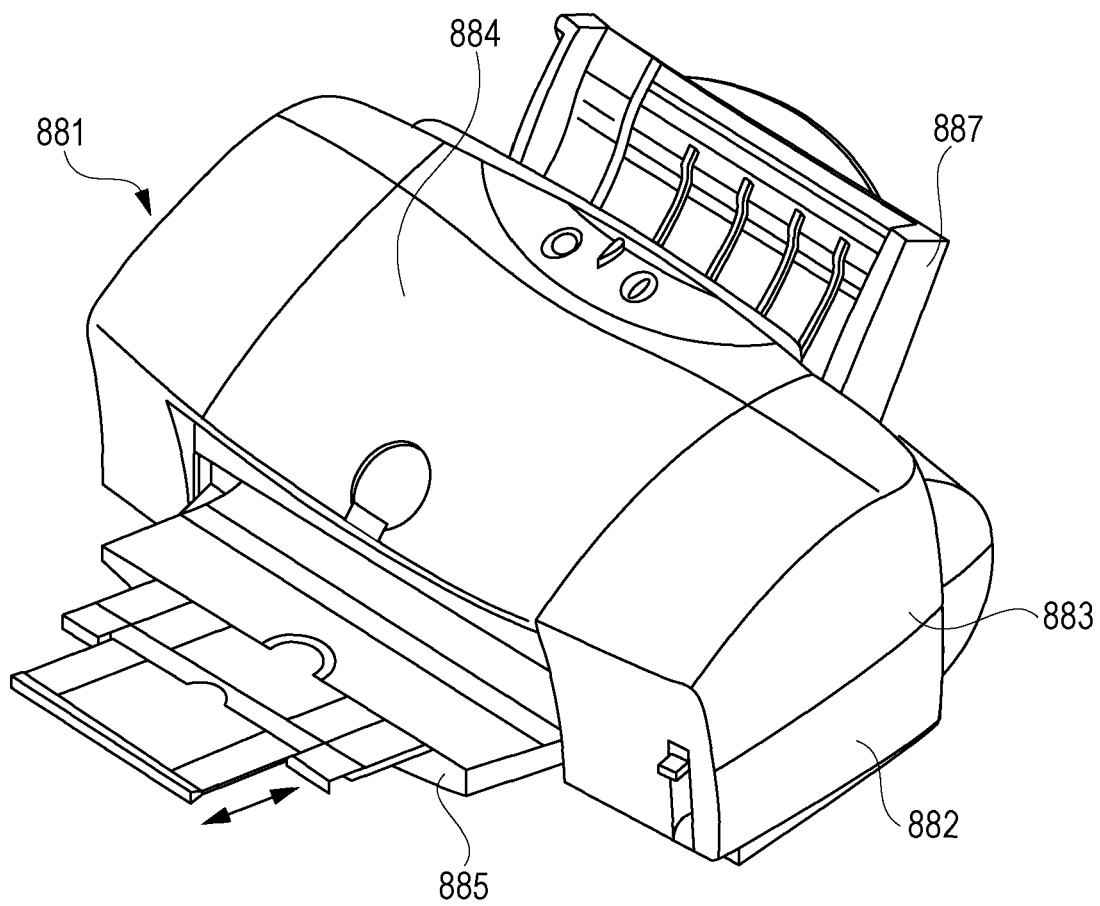
FIG. 4 is a schematic view of a liquid discharge apparatus according to an embodiment of the present invention.
Figure 5:
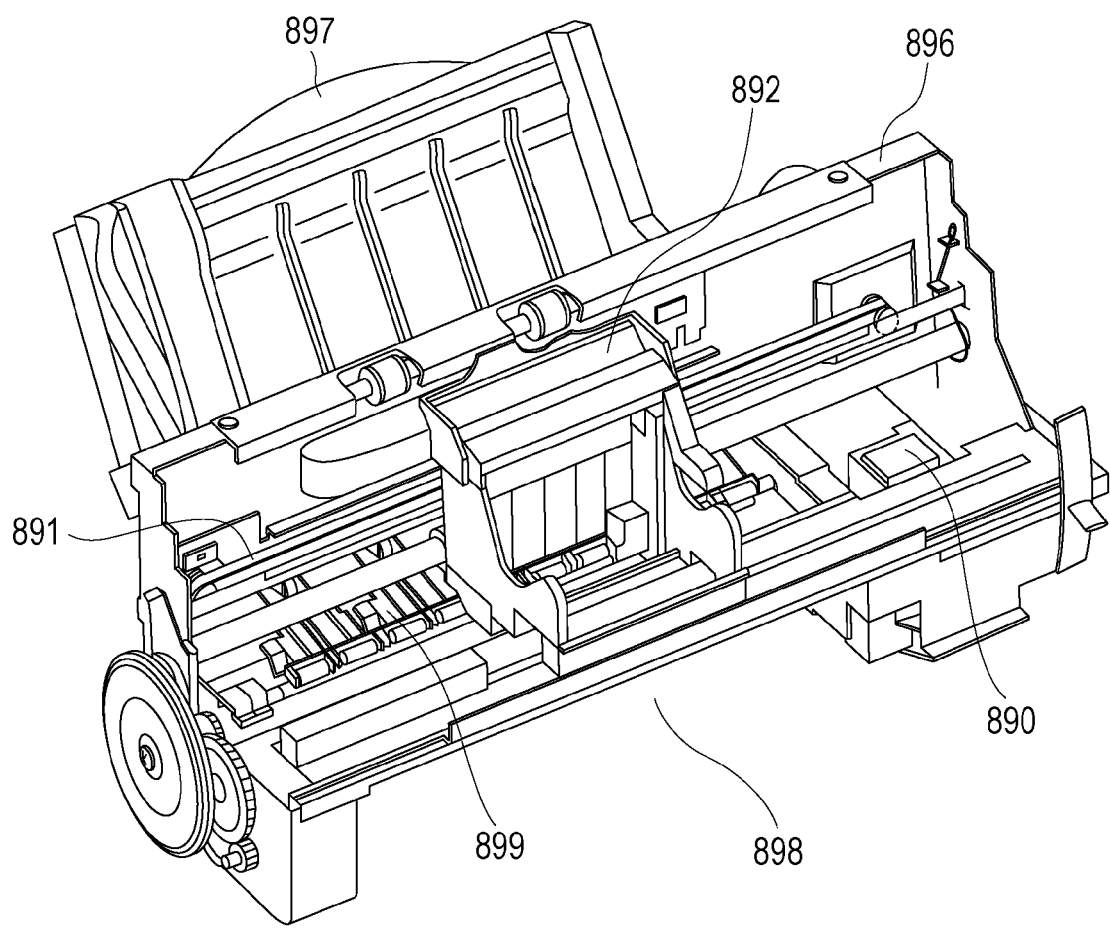
FIG. 5 is a schematic view of a liquid discharge apparatus according to an embodiment of the present invention.

The liquid discharge apparatus may be an ink jet recording apparatus, as illustrated in FIGS. 4 and 5. FIG. 5 illustrates the liquid discharge apparatus (ink jet recording apparatus) 881 illustrated in FIG. 4 without exteriors 882 to 885 and 887. The ink jet recording apparatus 881 includes an automatic feeder 897 for automatically feeding a recording paper sheet as a transfer medium to the main body 896 of the apparatus. The ink jet recording apparatus 881 further includes a conveying unit 899 serving as a stage configured to receive an object, which conveys a recording paper sheet from the automatic feeder 897 to a predetermined recording position and from the recording position to an outlet 898, a recording portion 891 for recording to the recording paper sheet at the recording position, and a recovering unit 890 for recovering the recording portion 891. The recording unit 891 includes a carriage 892 for housing a liquid discharge head according to an embodiment of the present invention. The carriage 892 travels along a rail.

In such an ink jet recording apparatus, the carriage 892 travels along a rail in response to electric signals sent from a computer. Upon the application of a driving voltage to electrodes disposed on a piezoelectric material, the piezoelectric material is deformed. Upon the deformation, the piezoelectric material presses the individual liquid chamber 102 via the diaphragm 103 illustrated in FIG. 3B, thereby discharging an ink from the orifice for discharging 105 to print characters.

A liquid discharge apparatus according to an embodiment of the present invention can uniformly discharge a liquid at a high speed and can be reduced in size.

In addition to the printer, a liquid discharge apparatus according to an embodiment of the present invention can be used in printing apparatuses, for example, ink jet recording apparatuses, such as facsimile machines, multifunction devices, and copiers, industrial liquid discharge apparatuses, and drawing apparatuses for objects.

Users can select a desired transfer medium for each application. The liquid discharge head may move relative to a transfer medium disposed on a stage configured to receive an object.

Ultrasonic Motor

An ultrasonic motor according to an embodiment of the present invention will be described below. An ultrasonic motor according to an embodiment of the present invention includes a vibrating member and a moving body in contact with the vibrating member. The vibrating member includes a piezoelectric element or a multilayered piezoelectric element according to an embodiment of the present invention.

Figure 6A:
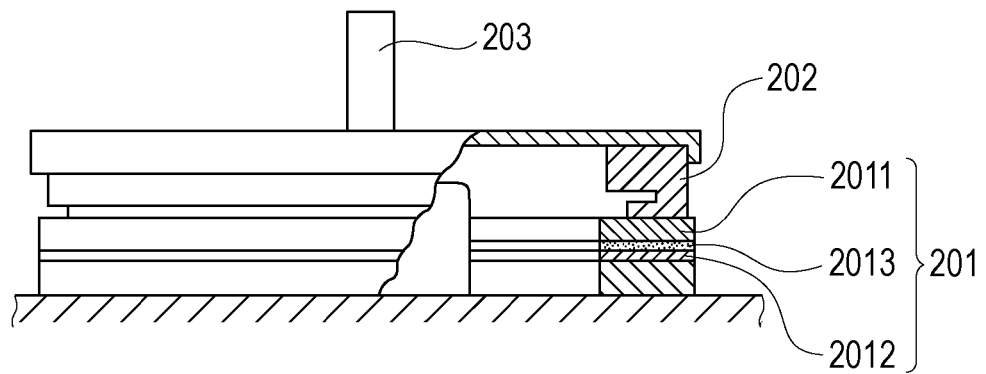
FIGS. 6A and 6B are schematic views of an ultrasonic motor according to an embodiment of the present invention.
Figure 6B:
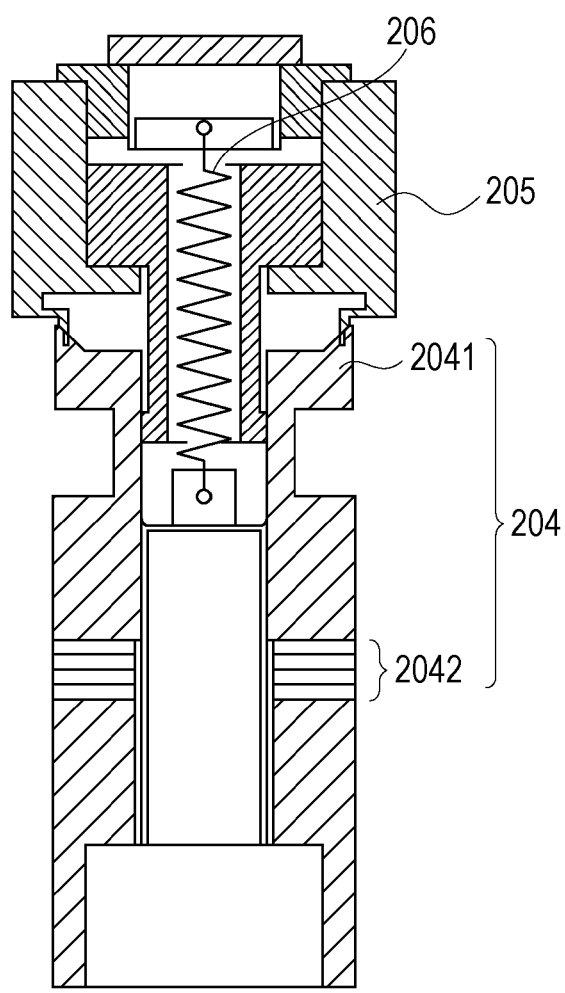

FIGS. 6A and 6B are schematic views of an ultrasonic motor according to an embodiment of the present invention. The ultrasonic motor illustrated in FIG. 6A includes a single plate of a piezoelectric element according to an embodiment of the present invention. The ultrasonic motor includes an oscillator 201, a rotor 202 pressed against a sliding surface of the oscillator 201 by the action of a pressure spring (not shown), and an output shaft 203, which is formed integrally with the rotor 202. The oscillator 201 includes a metal elastic ring 2011, a piezoelectric element 2012 according to an embodiment of the present invention, and an organic adhesive 2013 (such as epoxy or cyanoacrylate) that bonds the piezoelectric element 2012 to the elastic ring 2011. Although not shown in the figure, the piezoelectric element 2012 includes a piezoelectric material between a first electrode and a second electrode.

Upon the application of two-phase alternating voltages that differ by an odd number times π/2 in phase to a piezoelectric element according to an embodiment of the present invention, a flexural traveling wave occurs in the oscillator 201, and points on the sliding surface of the oscillator 201 go through elliptical motion. The rotor 202 pressed against the sliding surface of the oscillator 201 receives friction force from the oscillator 201 and rotates in a direction opposite to the direction of the flexural traveling wave. A body to be driven (not shown) joined to the output shaft 203 is driven by the rotational force of the rotor 202. Upon the application of a voltage to the piezoelectric material, the piezoelectric material expands and contracts because of the transverse piezoelectric effect. An elastic body, such as a metal body, joined to the piezoelectric element is bent with the expansion and contraction of the piezoelectric material. The ultrasonic motor described herein utilizes this principle.

FIG. 6B illustrates an ultrasonic motor that includes a multilayered piezoelectric element. The oscillator 204 includes a multilayered piezoelectric element 2042 in a tubular metal elastic body 2041. The multilayered piezoelectric element 2042 includes a plurality of layered piezoelectric materials (not shown) and includes a first electrode and a second electrode on the outer surfaces of the layered piezoelectric materials and internal electrodes within the layered piezoelectric materials. The metal elastic body 2041 is fastened with a bolt to hold the piezoelectric element 2042, thereby constituting the oscillator 204.

Upon the application of alternating voltages of different phases to the multilayered piezoelectric element 2042, the oscillator 204 causes two oscillations perpendicular to each other. The two oscillations are synthesized to form a circular oscillation for driving a leading edge portion of the oscillator 204. The oscillator 204 has an annular groove at its upper portion. The annular groove increases the oscillatory displacement for driving. A rotor 205 is pressed against the oscillator 204 by the action of a pressure spring 206 and receives friction force for driving. The rotor 205 is rotatably supported by a bearing.

Optical Apparatus

An optical apparatus according to an embodiment of the present invention will be described below. An optical apparatus according to an embodiment of the present invention includes a drive unit that includes the ultrasonic motor described above.

Figure 7A:
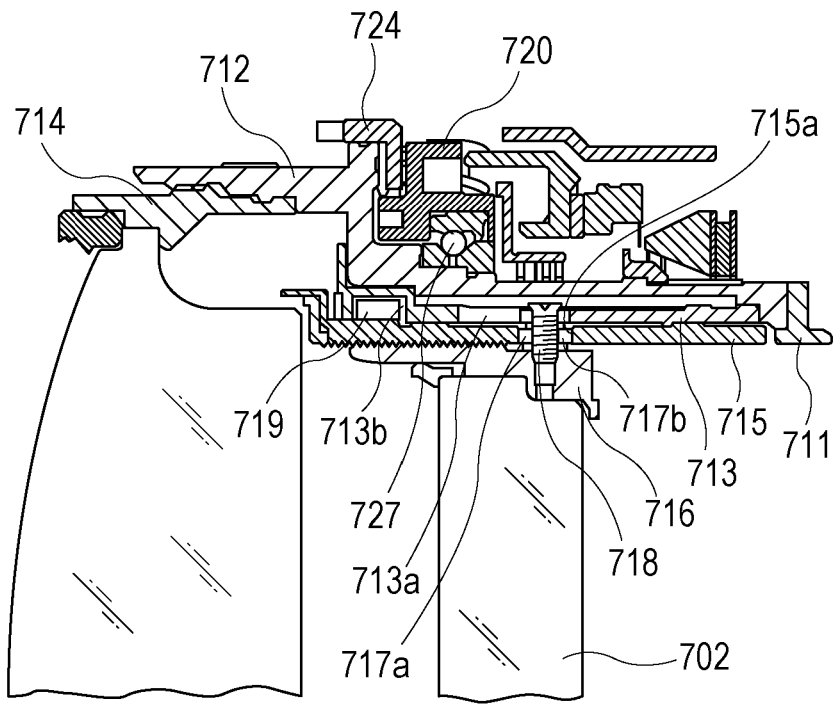
FIGS. 7A and 7B are schematic views of an optical apparatus according to an embodiment of the present invention.
Figure 7B:
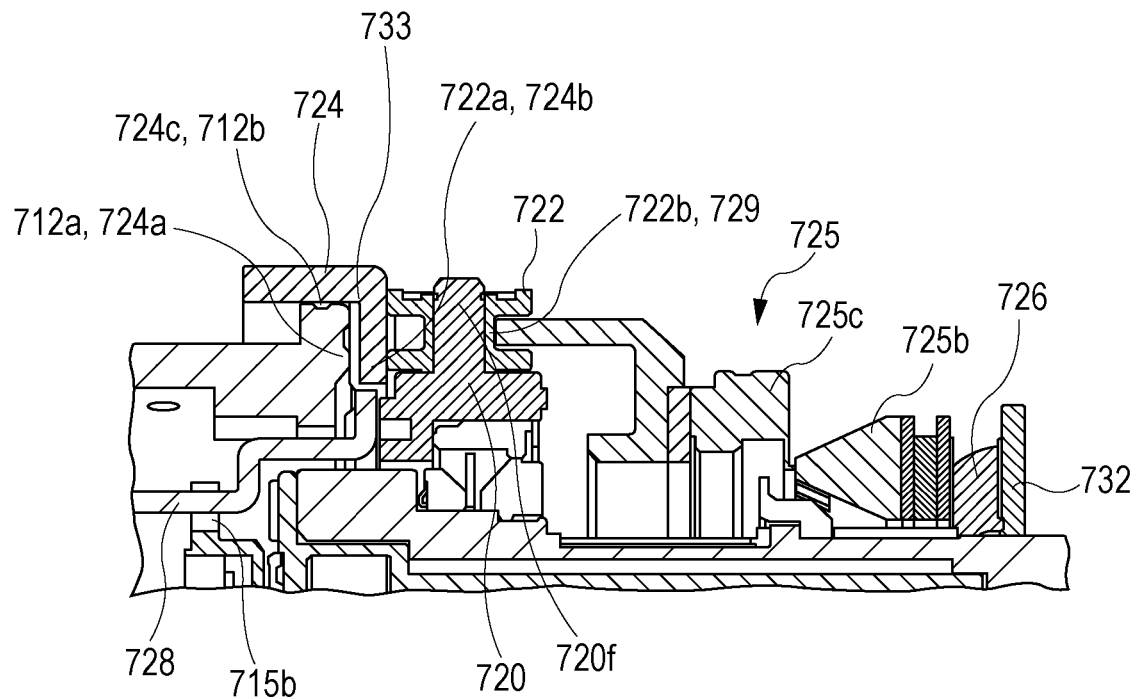
Figure 8:
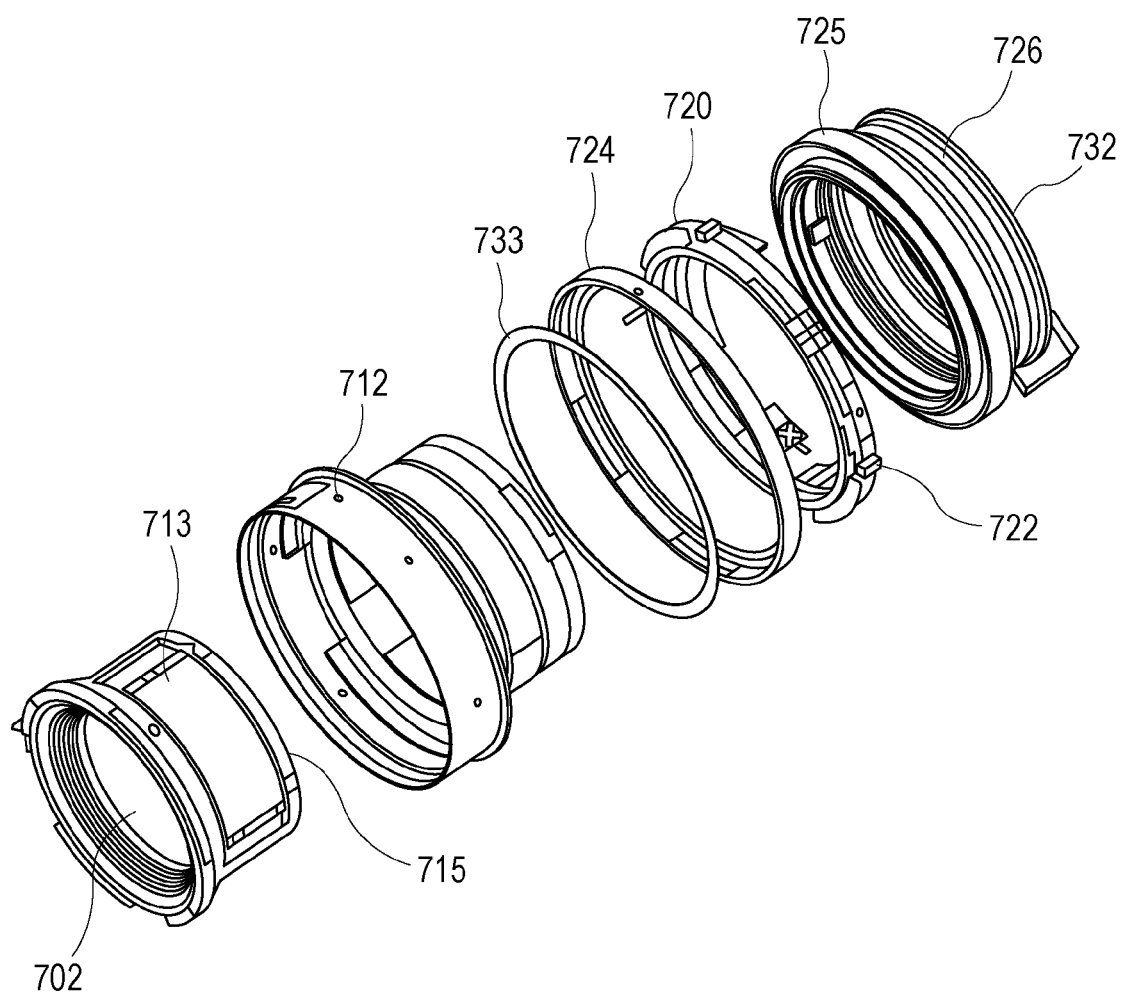
FIG. 8 is a schematic view of an optical apparatus according to an embodiment of the present invention.

FIGS. 7A and 7B are cross-sectional views of an interchangeable lens barrel of a single-lens reflex camera, which is an optical apparatus according to an embodiment of the present invention. FIG. 8 is an exploded perspective view of an interchangeable lens barrel of a single-lens reflex camera, which is an optical apparatus according to an embodiment of the present invention. A fixed barrel 712, a linear guide barrel 713, and a front lens group barrel 714 are fixed to a removable mount 711 of the camera. These components are fixed members of the interchangeable lens barrel.

The linear guide barrel 713 has a linear guide groove 713a for a focus lens 702 in the optical axis direction. The focus lens 702 is supported by a rear lens group barrel 716. Cam rollers 717a and 717b protruding outwardly in the radial direction are fixed to the rear lens group barrel 716 with a screw 718. The cam roller 717a fits in the linear guide groove 713a.

A cam ring 715 rotatably fits in the internal circumference of the linear guide barrel 713. A roller 719 fixed to the cam ring 715 is caught in an annular groove 713b of the linear guide barrel 713, thereby restricting the relative displacement of the linear guide barrel 713 and the cam ring 715 in the optical axis direction. The cam ring 715 has a cam groove 715a for the focus lens 702. The cam roller 717b also fits in the cam groove 715a.

A rotation transmitting ring 720 is rotatably held by a ball race 727 at a fixed position on the periphery of the fixed barrel 712. A driven roller 722 is rotatably held by a shaft 720f extending radially from the rotation transmitting ring 720. A large-diameter portion 722a of the driven roller 722 is in contact with a mount side end face 724b of a manual focus ring 724. A small-diameter portion 722b of the driven roller 722 is in contact with a joint member 729. Six driven rollers 722 are disposed at regular intervals on the periphery of the rotation transmitting ring 720. Each of the driven rollers 722 satisfies the structural relationship described above.

A low-friction sheet (washer member) 733 is disposed on the inside of the manual focus ring 724. The low-friction sheet 733 is disposed between a mount side end face 712a of the fixed barrel 712 and a front end face 724a of the manual focus ring 724. The low-friction sheet 733 has a circular outer surface having a diameter that fits to the bore diameter 724c of the manual focus ring 724. The bore diameter 724c of the manual focus ring 724 fits to the diameter of an outer portion 712b of the fixed barrel 712. The low-friction sheet 733 can reduce friction in the rotating ring mechanism in which the manual focus ring 724 rotates about the optical axis relative to the fixed barrel 712.

The large-diameter portion 722a of the driven roller 722 is pressed against the mount side end face 724b of the manual focus ring 724 because the wave washer 726 presses the ultrasonic motor 725 forward to the front of the lens. Likewise, because the wave washer 726 presses the ultrasonic motor 725 forward to the front of the lens, the small-diameter portion 722b of the driven roller 722 is appropriately pressed against the joint member 729. The wave washer 726 is prevented from moving toward the mount by a washer 732 bayonet coupled to the fixed barrel 712. The spring force (impellent force) of the wave washer 726 is transmitted to the ultrasonic motor 725 and the driven roller 722 and also presses the manual focus ring 724 against the mount side end face 712a of the fixed barrel 712. In other words, the manual focus ring 724 is pressed against the mount side end face 712a of the fixed barrel 712 via the low-friction sheet 733.

Thus, when the ultrasonic motor 725 is rotated by a control unit (not shown) relative to the fixed barrel 712, the driven roller 722 rotates about the shaft 720f because the joint member 729 is in frictional contact with the small-diameter portion 722b of the driven roller 722. The rotation of the driven roller 722 about the shaft 720f causes the rotation of the rotation transmitting ring 720 about the optical axis (automatic focusing).

When a manual input portion (not shown) provides the manual focus ring 724 with rotational force about the optical axis, since the mount side end face 724b of the manual focus ring 724 is pressed against the large-diameter portion 722a of the driven roller 722, the driven roller 722 is rotated about the shaft 720f due to friction force. The rotation of the large-diameter portion 722a of the driven roller 722 about the shaft 720f causes the rotation of the rotation transmitting ring 720 about the optical axis. However, the ultrasonic motor 725 is not rotated because of the friction force between a rotor 725c and a stator 725b (manual focusing).

The rotation transmitting ring 720 is provided with two focus keys 728 facing each other. These focus keys 728 fit into notches 715b at a leading edge of the cam ring 715. Upon automatic focusing or manual focusing, the rotation transmitting ring 720 is rotated about the optical axis, and the rotational force is transmitted to the cam ring 715 via the focus keys 728. When the cam ring 715 is rotated about the optical axis, the cam roller 717b moves the cam roller 717a and the rear lens group barrel 716 restricted by the linear guide groove 713a forward or backward along the cam groove 715a of the cam ring 715. This drives the focus lens 702 and allows focusing.

Although an optical apparatus according to an embodiment of the present invention has been described with reference to an interchangeable lens barrel of a single-lens reflex camera, the optical apparatus may also be applied to optical apparatuses that include an ultrasonic motor in a drive unit, for example, cameras, such as compact cameras, electronic still cameras, and personal digital assistants including a camera.

Vibratory Apparatus and Dust Removing Device

Vibratory apparatuses for conveying or removing particles, powders, and droplets are widely used in electronic equipment.

As an example of a vibratory apparatus according to an embodiment of the present invention, a dust removing device that includes a piezoelectric element according to an embodiment of the present invention will be described below. A vibratory apparatus according to an embodiment of the present invention includes a vibrating member that includes a piezoelectric element or a multilayered piezoelectric element according to an embodiment of the present invention on a diaphragm. A dust removing device according to an embodiment of the present invention includes the vibratory apparatus in a vibrating portion.

Figure 9A:
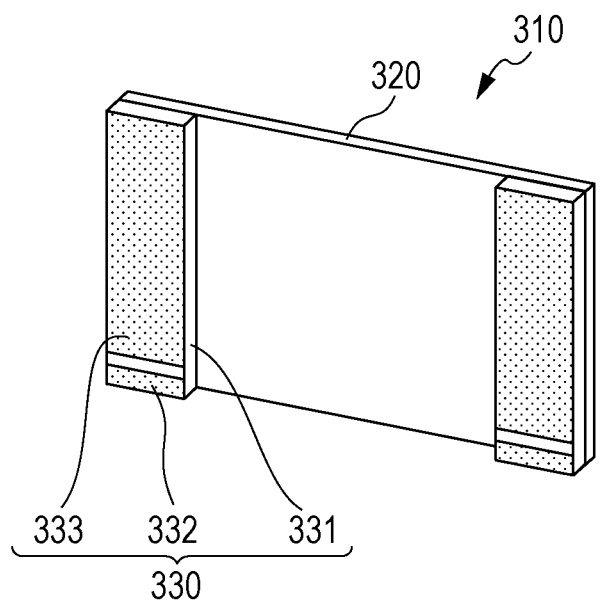
FIGS. 9A and 9B are schematic views of a dust removing device including a vibratory apparatus according to an embodiment of the present invention.
Figure 9B:
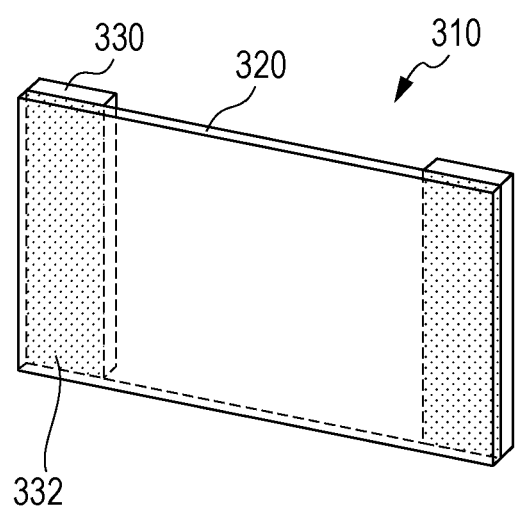

FIGS. 9A and 9B are schematic views of a dust removing device 310 according to an embodiment of the present invention. The dust removing device 310 includes a plate of a piezoelectric element 330 and a diaphragm 320. The piezoelectric element 330 may be a multilayered piezoelectric element according to an embodiment of the present invention.

The diaphragm 320 may be made of any material. When the dust removing device 310 is used in optical devices, the diaphragm 320 may be made of a light transmitting material or a light reflective material.

Figure 10A:
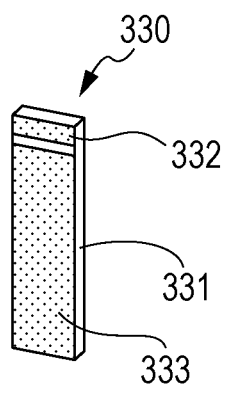
FIGS. 10A to 10C are schematic views of a piezoelectric element of a dust removing device according to an embodiment of the present invention.
Figure 10B:
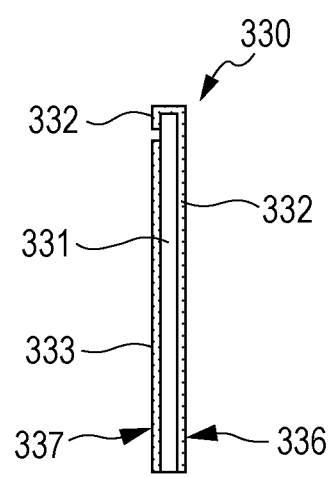
Figure 10C:
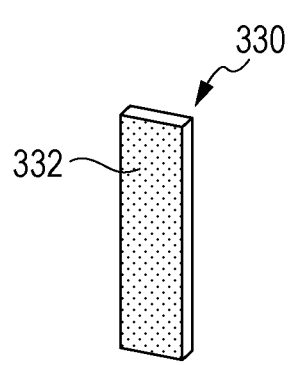

FIGS. 10A to 10C are schematic views of the piezoelectric element 330 illustrated in FIGS. 9A and 9B. FIGS. 10A and 10C illustrate the front and back sides of the piezoelectric element 330. FIG. 10B is a side view of the piezoelectric element 330. As illustrated in FIGS. 9A and 9B, the piezoelectric element 330 includes a piezoelectric material 331, a first electrode 332, and a second electrode 333. The first electrode 332 and the second electrode 333 are disposed on opposite sides of the piezoelectric material 331. As in FIGS. 9A and 9B, the piezoelectric element 330 may be a multilayered piezoelectric element according to an embodiment of the present invention. In this case, the piezoelectric material 331 includes piezoelectric material layers and internal electrodes alternately stacked on top of one another. The internal electrodes are alternately connected to the first electrode 332 and the second electrode 333, thereby allowing the piezoelectric material layers to alternately have driving waveforms of different phases. As illustrated in FIG. 10C, a surface of the piezoelectric element 330 on which the first electrode 332 is disposed is referred to as a first electrode surface 336. As illustrated in FIG. 10A, a surface of the piezoelectric element 330 on which the second electrode 333 is disposed is referred to as a second electrode surface 337.

The term "electrode surface", as used herein, refers to a surface of a piezoelectric element on which an electrode is disposed. For example, as illustrated in FIG. 10B, the first electrode 332 may round a corner and extends to the second electrode surface 337.

As illustrated in FIGS. 9A and 9B, the first electrode surface 336 of the piezoelectric element 330 is bonded to the diaphragm 320. Actuation of the piezoelectric element 330 produces a stress between the piezoelectric element 330 and the diaphragm 320, thereby causing out-of-plane oscillations on the diaphragm 320. The dust removing device 310 removes foreign substances, such as dust, on the diaphragm 320 by the action of out-of-plane oscillations. The term "out-of-plane oscillations", as used herein, refers to elastic oscillations that cause displacements of a diaphragm in the optical axis direction or the diaphragm thickness direction.

Figure 11A:
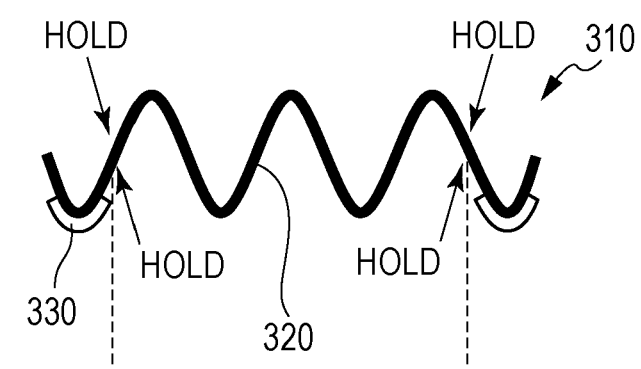
FIGS. 11A and 11B are schematic views illustrating the vibration principle of a dust removing device according to an embodiment of the present invention.
Figure 11B:
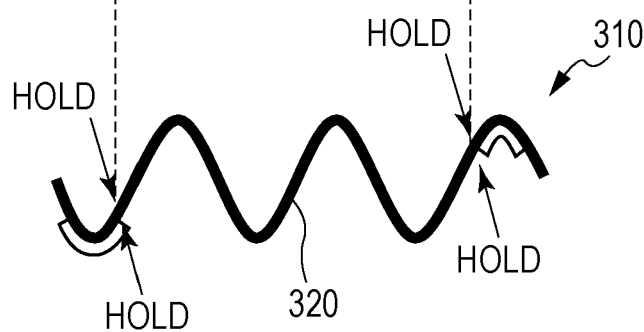

FIGS. 11A and 11B are schematic views illustrating the vibration principle of the dust removing device 310. In FIG. 11A, in-phase alternating voltages are applied to a left-and-right pair of the piezoelectric elements 330 to cause out-of-plane oscillations of the diaphragm 320. The direction of polarization of the piezoelectric material constituting the left-and-right pair of the piezoelectric elements 330 is the same as the thickness direction of the piezoelectric elements 330. The dust removing device 310 is driven in a seventh oscillation mode. In FIG. 11B, an anti-phase alternating voltage is applied to a left-and-right pair of the piezoelectric elements 330 to cause out-of-plane oscillations of the diaphragm 320. The dust removing device 310 is driven in a sixth oscillation mode. The dust removing device 310 can employ at least two oscillation modes to effectively remove dust on the surface of the diaphragm.

Image Pickup Apparatus

Figure 12:
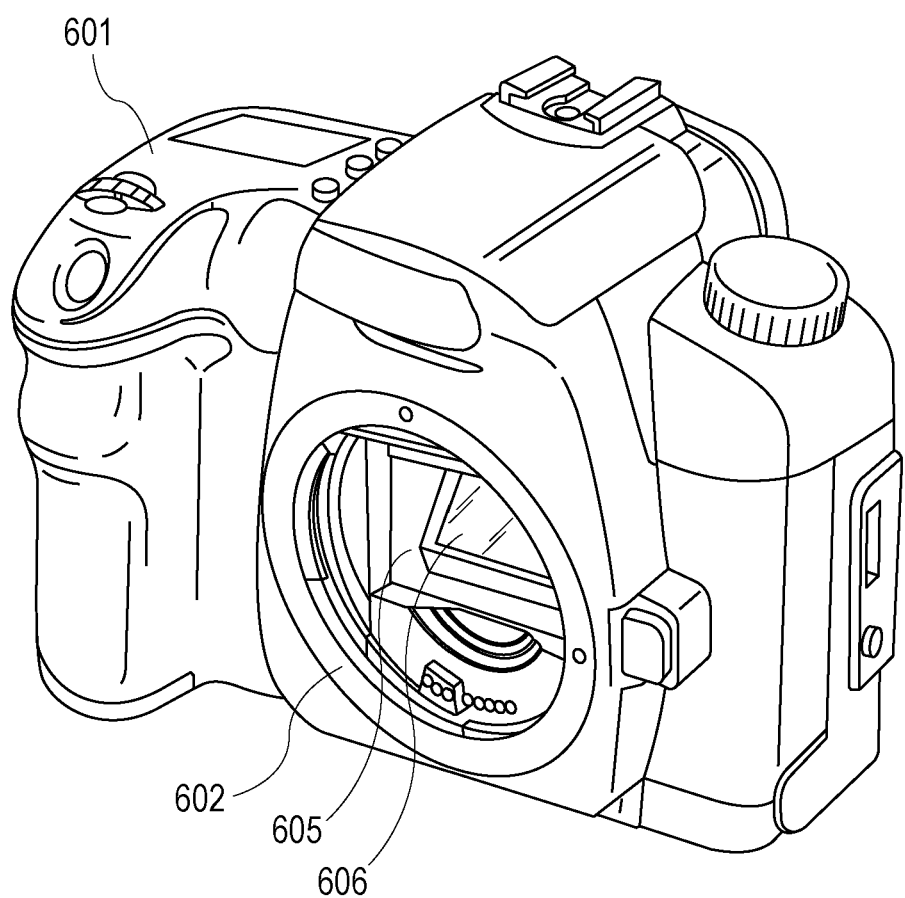
FIG. 12 is a schematic view of an image pickup apparatus according to an embodiment of the present invention.
Figure 13:
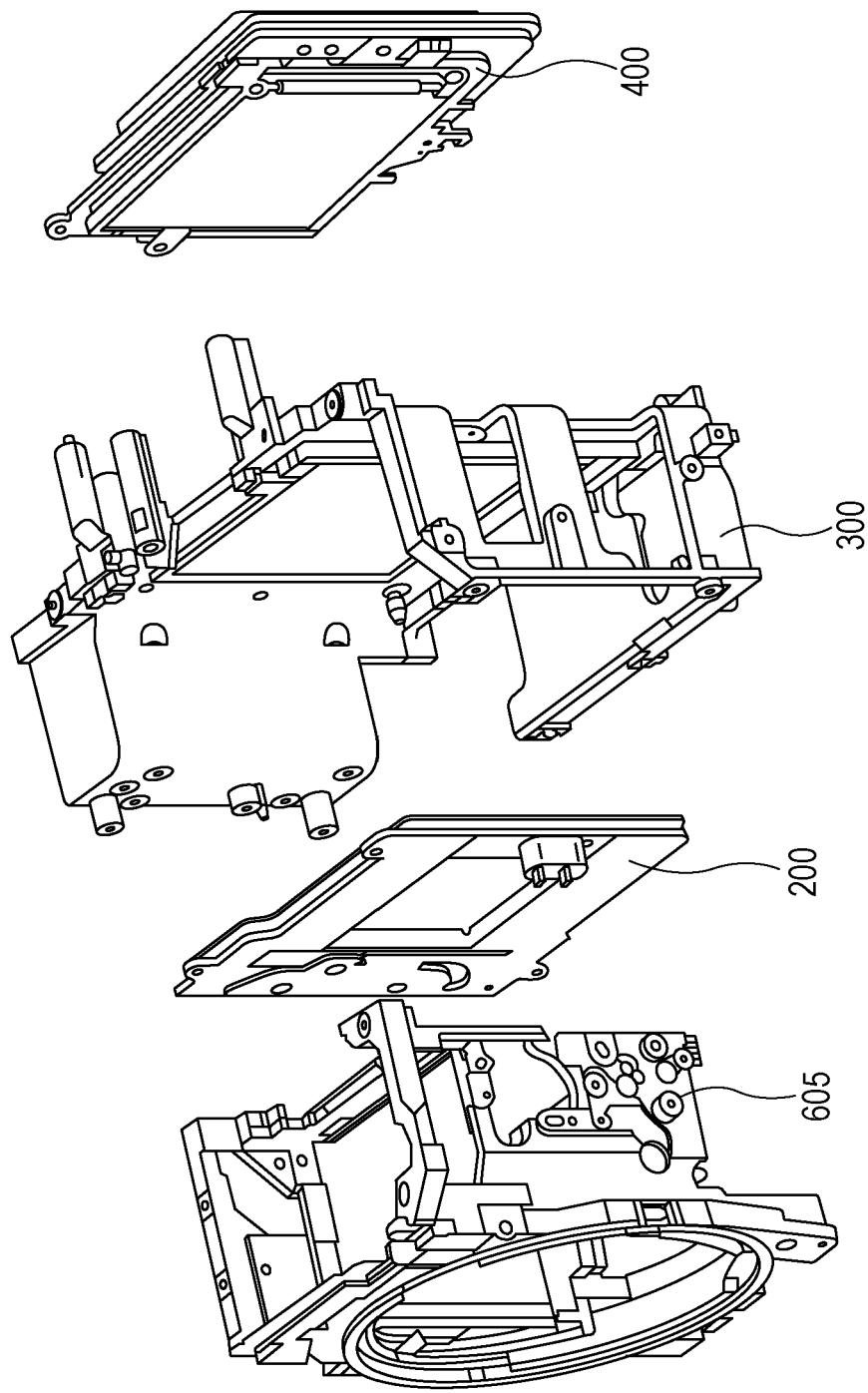
FIG. 13 is a schematic view of an image pickup apparatus according to an embodiment of the present invention.

An image pickup apparatus according to an embodiment of the present invention will be described below. An image pickup apparatus according to an embodiment of the present invention includes a dust removing device according to an embodiment of the present invention and an image pickup element unit. The dust removing device includes a diaphragm on the light-receiving surface of the image pickup element unit. FIGS. 12 and 13 illustrate a digital single-lens reflex camera, which is an image pickup apparatus according to an embodiment of the present invention.

FIG. 12 is a front perspective view of a main body 601 of the camera viewed from the object side. A taking lens unit has been removed. FIG. 13 is an exploded perspective view of the inside of the camera, illustrating surrounding structures of a dust removing device according to an embodiment of the present invention and an image pickup unit 400.

The main body 601 of the camera includes a mirror box 605 to which an image light beam passing through a taking lens is directed. The mirror box 605 includes a main mirror (quick return mirror) 606. The main mirror 606 can make an angle of 45 degrees with the optical axis to direct an image light beam to a penta roof mirror (not shown) or may avoid the image light beam in order to direct the image light beam to an image pickup element (not shown).

The mirror box 605 and a shutter unit 200 are disposed in front of a main body chassis 300 of the main body 601 of the camera in this order from the object side. The image pickup unit 400 is disposed on the photographer side of the main body chassis 300. The image pickup unit 400 is installed such that an imaging plane of the image pickup element is disposed at a predetermined distance from and parallel to the surface of a mount 602 to which a taking lens unit is to be attached.

The image pickup unit 400 includes a vibrating component of a dust removing device and an image pickup element unit. The vibrating component of the dust removing device is disposed on the same axis as the light-receiving surface of the image pickup element unit.

Although the digital single-lens reflex camera has been described as an image pickup apparatus according to an embodiment of the present invention, the image pickup apparatus may be an interchangeable-lens camera, such as a mirrorless digital interchangeable-lens camera without the mirror box 605. Among various image pickup apparatuses and electrical and electronic equipment that include image pickup apparatuses, such as interchangeable-lens video cameras, copiers, facsimile machines, and scanners, an image pickup apparatus according to an embodiment of the present invention can particularly be applied to devices that require the removal of dust deposited on a surface of an optical part.

Electronic Equipment

Electronic equipment according to an embodiment of the present invention will be described below. Electronic equipment according to an embodiment of the present invention includes a piezoelectric acoustic component that includes a piezoelectric element or a multilayered piezoelectric element according to an embodiment of the present invention. The piezoelectric acoustic component may be a loudspeaker, a buzzer, a microphone, or a surface acoustic wave (SAW) device.

Figure 14:
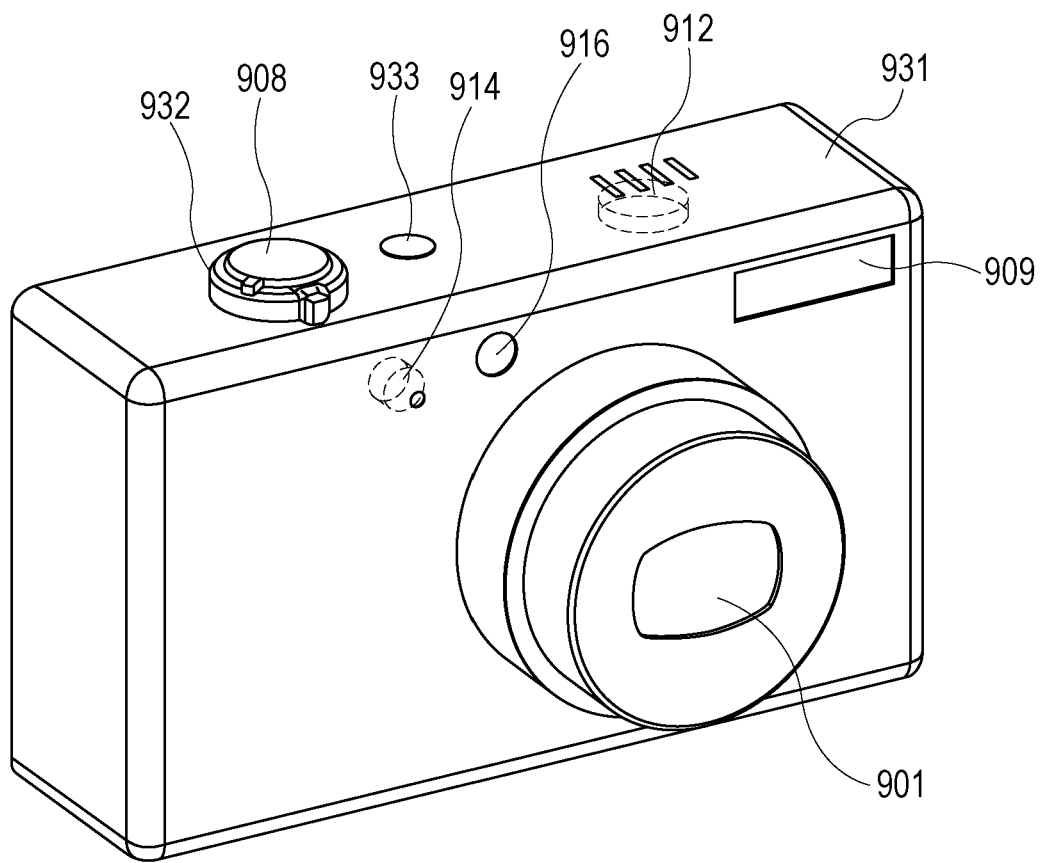
FIG. 14 is a schematic view of electronic equipment according to an embodiment of the present invention.

FIG. 14 is a front perspective view of a main body 931 of a digital camera, which is electronic equipment according to an embodiment of the present invention. An optical device 901, a microphone 914, an electronic flash unit 909, and a fill light unit 916 are disposed on the front surface of the main body 931. The microphone 914 is disposed within the main body 931 and is indicated by a broken line. An opening for catching external sound is disposed in front of the microphone 914.

A power switch 933, a loudspeaker 912, a zoom lever 932, and a release button 908 for focusing are disposed on the top surface of the main body 931. The loudspeaker 912 is disposed within the main body 931 and is indicated by a broken line. An opening for transmitting sound to the outside is disposed in front of the loudspeaker 912.

The piezoelectric acoustic component may be used in at least one of the microphone 914, the loudspeaker 912, and a surface acoustic wave device.

Although the digital camera has been described as electronic equipment according to an embodiment of the present invention, the electronic equipment may also be applied to electronic equipment that includes a piezoelectric acoustic component, such as audio-reproducing devices, audio-recording devices, mobile phones, and information terminals.

As described above, a piezoelectric element and a multi-layered piezoelectric element according to an embodiment of the present invention are suitable for liquid discharge heads, liquid discharge apparatuses, ultrasonic motors, optical apparatuses, vibratory apparatuses, dust removing devices, image pickup apparatuses, and electronic equipment. A piezoelectric element and a multilayered piezoelectric element according to an embodiment of the present invention are particularly suitable for low-temperature operation.

A liquid discharge head manufactured by using a piezoelectric element or a multilayered piezoelectric element according to an embodiment of the present invention can have a nozzle density and a discharge velocity higher than or equal to those of liquid discharge heads manufactured by using a lead-containing piezoelectric element.

A liquid discharge apparatus manufactured by using a liquid discharge head according to an embodiment of the present invention can have a discharge velocity and discharge accuracy higher than or equal to those of liquid discharge apparatuses manufactured by using a lead-containing piezoelectric element.

An ultrasonic motor manufactured by using a piezoelectric element or a multilayered piezoelectric element according to an embodiment of the present invention can have driving force and durability higher than or equal to those of ultrasonic motors manufactured by using a lead-containing piezoelectric element.

An optical apparatus manufactured by using an ultrasonic motor according to an embodiment of the present invention can have durability and operation accuracy higher than or equal to those of optical apparatuses manufactured by using a lead-containing piezoelectric element.

A vibratory apparatus manufactured by using a piezoelectric element or a multilayered piezoelectric element according to an embodiment of the present invention can have vibratory capacity and durability higher than or equal to those of vibratory apparatuses manufactured by using a lead-containing piezoelectric element.

A dust removing device manufactured by using a vibratory apparatus according to an embodiment of the present invention can have dust removal efficiency and durability higher than or equal to those of dust removing devices manufactured by using a lead-containing piezoelectric element.

An image pickup apparatus manufactured by using a dust removing device according to an embodiment of the present invention can have a dust removal function higher than or equal to that of image pickup apparatuses manufactured by using a lead-containing piezoelectric element.

Electronic equipment manufactured by using a piezoelectric acoustic component that includes a piezoelectric element or a multilayered piezoelectric element according to an embodiment of the present invention can have sound production ability higher than or equal to that of electronic equipment manufactured by using a lead-containing piezoelectric element.

A piezoelectric material according to an embodiment of the present invention may be used in ultrasonic transducers, piezoelectric actuators, piezoelectric sensors, and ferroelectric memories, as well as liquid discharge heads and motors.

EXEMPLARY EMBODIMENTS

Although the present invention is further described in the following exemplary embodiments, the present invention is not limited to these exemplary embodiments.

A piezoelectric material according to an exemplary embodiment of the present invention was produced as described below.

Piezoelectric Material

Piezoelectric Material According to Exemplary Embodiment 1

A raw material having the composition $(Ba_{0.964}Ca_{0.036})_{1.0020}(Ti_{0.967}Sn_{0.033})O_3$, which is represented by the general formula (1) $(Ba_{1-x}Ca_x)_a(Ti_{1-y-z}Sn_yZr_z)O_3$, wherein $x=0.036$, $y=0.033$, $z=0$, and $a=1.0020$, was weighed as described below.

Raw powders of barium titanate having an average particle size of 100 nm and a purity of 99.99% or more, calcium titanate having an average particle size of 300 nm and a purity of 99.99% or more, and calcium stannate having an average particle size of 300 nm and a purity of 99.99% or more were prepared using a solid phase method. These raw powders were weighed such that Ba, Ca, Ti, and Sn satisfied the composition $(Ba_{0.964}Ca_{0.036})_{1.0020}(Ti_{0.967}Sn_{0.033})O_3$. The value a representing the ratio of the number of moles of Ba and Ca at the A site to the number of moles of Ti and Sn at the B site was controlled with barium carbonate and calcium carbonate.

Manganese dioxide was weighed such that a first auxiliary component Mn content on a metal basis was 0.150 parts by weight per 100 parts by weight of the composition $(Ba_{0.964}Ca_{0.036})_{1.0020}(Ti_{0.967}Sn_{0.033})O_3$. Bismuth oxide was weighed such that a second auxiliary component Bi content on a metal basis was 0.280 parts by weight per 100 parts by weight of the main component metal oxide. Silicon dioxide and boron oxide were weighed such that third auxiliary components Si and B on a metal basis were 0.033 and 0.017 parts by weight, respectively, per 100 parts by weight of the main component metal oxide.

These weighed powders were dry-blended in a ball mill for 24 hours. The mixed powder was granulated with 3 parts by weight of a PVA binder per 100 parts by weight of the mixed powder using a spray dryer.

The resulting granulated powder was charged in a mold and was pressed at 200 MPa with a pressing machine to form a discoidal compact. The compact could be further pressed with a cold isostatic pressing machine, and the further pressed compact had the same results.

The compact was held in an electric furnace at the maximum temperature $T_{max}$ of 1200° C. for 4 hours and was sintered in the ambient atmosphere for 18 hours in total, yielding a ceramic formed of a piezoelectric material according to an embodiment of the present invention.

The average equivalent circular diameter and relative density of crystal grains of the ceramic were determined. The average equivalent circular diameter was 0.96 μm, and the relative density was 99.1%. The crystal grains were observed mainly with a polarizing microscope. A small crystal grain size was determined with a scanning electron microscope (SEM). Photographic images taken with the polarizing microscope and the scanning electron microscope were processed to determine the average equivalent circular diameter. The relative density was measured in accordance with Archimedes' principle.

The ceramic was polished to a thickness of 0.5 mm, and the crystal structure of the ceramic was analyzed using X-ray diffraction. Only peaks corresponding to a perovskite structure were observed.

The composition of the ceramic was determined using ICP spectroscopy. The results showed that the piezoelectric material was mainly composed of a metal oxide represented by the chemical formula $(Ba_{0.964}Ca_{0.036})_{1.0020}(Ti_{0.967}Sn_{0.033})O_3$ and contained on a metal basis 0.150 parts by weight of Mn, 0.280 parts by weight of Bi, 0.033 parts by weight of Si, and 0.017 parts by weight of B per 100 parts by weight of the main component metal oxide.

The crystal grains were again observed. The average equivalent circular diameter was not significantly changed by polishing.

Piezoelectric Materials According to Exemplary Embodiments 2 to 65

Piezoelectric materials according to Exemplary Embodiments 2 to 65 were produced in the same manner as in Exemplary Embodiment 1. In addition to the raw materials used in Exemplary Embodiment 1, a barium zirconate powder (having an average particle size of 300 nm and a purity of 99.99% or more) and lithium carbonate were used if necessary. First, the raw powders were weighed at the Ba, Ca, Ti, Sn, and Zr ratio listed in Table 1. The value a representing the ratio of the number of moles of Ba and Ca at the A site to the number of moles of Ti, Sn, and Zr at the B site was controlled with barium carbonate and calcium carbonate. Manganese dioxide, bismuth oxide, lithium carbonate, silicon dioxide, and boron oxide were weighed such that the amounts of a first auxiliary component Mn, second auxiliary components Bi and Li, and third auxiliary components Si and B on a metal basis per 100 parts by weight of barium titanate, calcium titanate, calcium stannate, calcium zirconate, barium oxalate, and calcium oxalate based on a chemical formula $(Ba_{1-x}Ca_x)_a(Ti_{1-y-z}Sn_yZr_z)O_3$ satisfied the proportions listed in Table 1.

These weighed powders were dry-blended in a ball mill for 24 hours. The mixed powder was granulated with 3 parts by weight of a PVA binder per 100 parts by weight of the mixed powder using a spray dryer.

The resulting granulated powder was charged in a mold and was pressed at 200 MPa with a pressing machine to form a discoidal compact.

The compact was held in an electric furnace at the maximum temperature $T_{max}$ listed in Table 1 for 4 hours and was sintered in the ambient atmosphere for 18 hours in total, yielding a ceramic formed of a piezoelectric material according to an embodiment of the present invention.

The average equivalent circular diameter and the relative density were determined in the same manner as in Exemplary Embodiment 1. Table 2 shows the results.

The composition analysis was performed in the same manner as in Exemplary Embodiment 1. In all the piezoelectric materials, the composition of Ba, Ca, Ti, Sn, Zr, Mn, Bi, Li, Si, and B weighed was the same as the composition after sintering.

Metal Oxide Materials According to Comparative Examples 1 to 24

Comparative metal oxide materials were produced in the same manner as in Exemplary Embodiment 1. Table 1 listed the main components, the first auxiliary component, the second auxiliary component, the third auxiliary component, the mole ratio a between the A site and the B site, and the maximum temperature $T_{max}$ in sintering.

The average equivalent circular diameter and the relative density were determined in the same manner as in Exemplary Embodiment 1. Table 2 shows the results.

The composition analysis was performed in the same manner as in Exemplary Embodiment 1. In all the metal oxide materials, the composition of Ba, Ca, Ti, Zr, Sn, Mn, Bi, Li, Si, and B weighed was the same as the composition after sintering.

Exemplary Embodiments without Third Component

Exemplary Embodiment 66

Barium titanate, calcium titanate, barium stannate, barium zirconate, and barium oxalate raw powders used in Exemplary Embodiments 1 to 65 were weighed such that the main components Ba, Ca, Ti, Zr, and Sn of the metal oxide represented by the general formula (1) $(Ba_{1-x}Ca_x)_a(Ti_{1-y-z}Sn_yZr_z)O_3$ had the ratio listed in Table 1. Manganese dioxide and bismuth oxide were weighed such that the first auxiliary component Mn content and the second auxiliary component Bi content on a metal basis per 100 parts by weight of the main component metal oxide were adjusted to the values listed in Table 1.

These weighed powders were mixed and granulated in the same manner as in Exemplary Embodiment 1. The powders were baked at the maximum temperature $T_{max}$ listed in Table 1 in the same manner as in Exemplary Embodiment 1.

The average equivalent circular diameter and the relative density were determined in the same manner as in Exemplary Embodiment 1. Table 2 shows the results.

The composition was determined in the same manner as in Exemplary Embodiment 1. The composition of Ba, Ca, Ti, Sn, Mn, and Bi weighed was the same as the composition after sintering.

Piezoelectric Materials According to Exemplary Embodiments 67 to 82

Piezoelectric materials were produced at the component ratios and at the maximum temperature $T_{max}$ listed in Table 1 in the same manner as in Exemplary Embodiment 66. The average equivalent circular diameter and the relative density of the piezoelectric materials were determined. Table 2 shows the results.

The composition was determined in the same manner as in Exemplary Embodiment 1. The composition of Ba, Ca, Ti, Sn, Zr, Mn, and Bi weighed was the same as the composition after sintering.

Figure 15A:
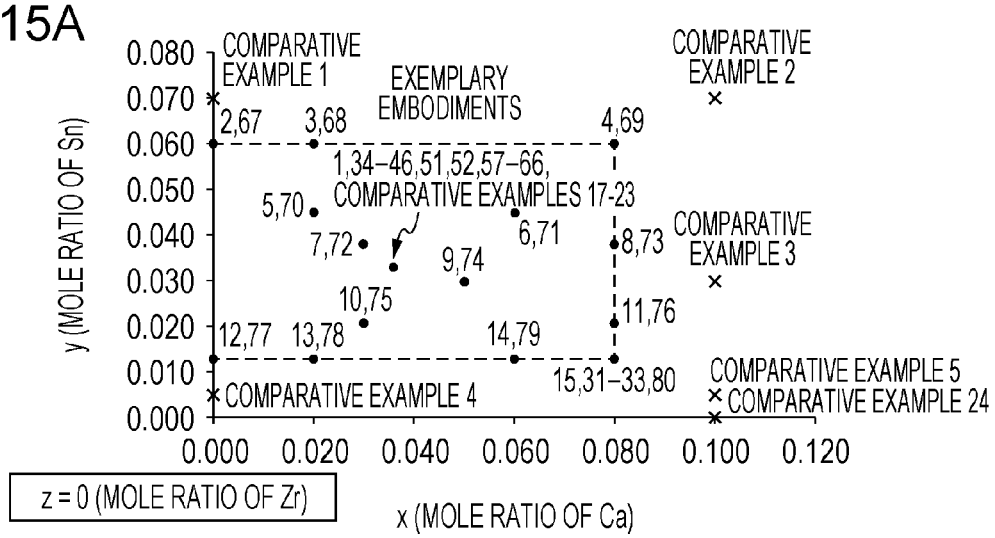
FIGS. 15A to 15C are phase diagrams illustrating the relationship between the x-values, the y-values, and the z-values of piezoelectric materials according to exemplary embodiments and metal oxide materials according to comparative examples of the present invention.
Figure 15B:
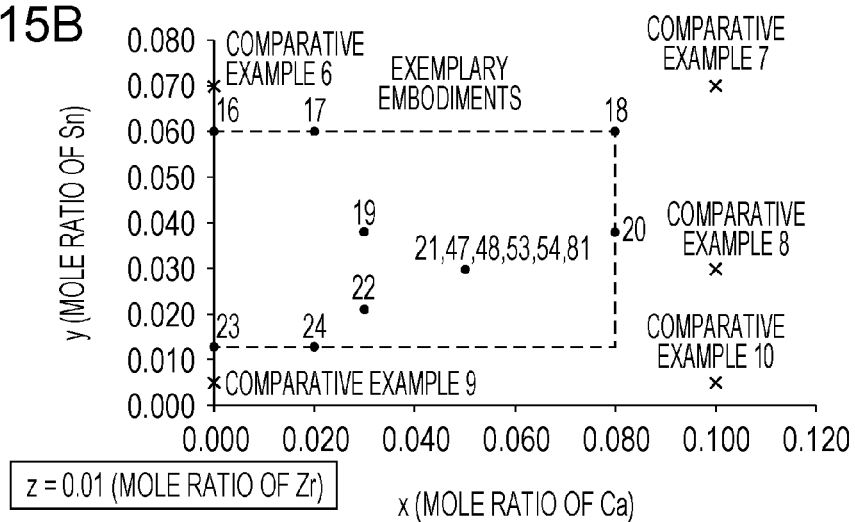
Figure 15C:
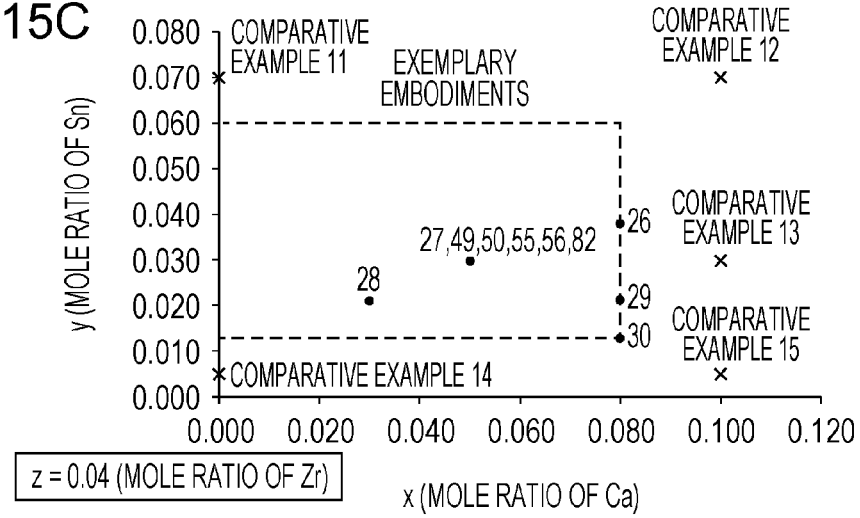

FIGS. 15A to 15C are phase diagrams illustrating the relationship between the x-values, the y-values, and the z-values of the piezoelectric materials according to Exemplary Embodiments 1 to 82 and the metal oxide materials according to Comparative Examples 1 to 24. The regions surrounded by the dotted lines are within the ranges of the x- and y-values of the general formula (1). The x-value denotes the mole ratio of Ca and is in the range of $0 \leq x \leq 0.080$. The y-value denotes the mole ratio of Sn and is in the range of $0.013 \leq y \leq 0.060$. FIG. 15A corresponds to z=0. FIG. 15B corresponds to z=0.010. FIG. 15C corresponds to z=0.040.

TABLE 1

| | Main component | | | | | First auxiliary component | Second auxiliary component | | Third auxiliary component | | | Maximum temperature $T_{max}$ [° C.] |
|---|---|---|---|---|---|---|---|---|---|---|---|---|
| | Ba 1−x | Ca x | Ti 1−y−z | Sn y | Zr z | A/B a | Mn Parts by weight | Bi Parts by weight | Li Parts by weight | Si Parts by weight | B Parts by weight | Total Parts by weight | |
| Exemplary embodiment 1 | 0.964 | 0.036 | 0.967 | 0.033 | 0 | 1.0020 | 0.150 | 0.280 | 0 | 0.0330 | 0.0170 | 0.0500 | 1200 |
| Exemplary embodiment 2 | 1.000 | 0 | 0.940 | 0.060 | 0 | 1.0020 | 0.150 | 0.280 | 0 | 0.0330 | 0.0170 | 0.0500 | 1200 |
| Exemplary embodiment 3 | 0.980 | 0.020 | 0.940 | 0.060 | 0 | 1.0020 | 0.150 | 0.280 | 0 | 0.0330 | 0.0170 | 0.0500 | 1200 |
| Exemplary embodiment 4 | 0.920 | 0.080 | 0.940 | 0.060 | 0 | 1.0020 | 0.150 | 0.280 | 0 | 0.0330 | 0.0170 | 0.0500 | 1200 |
| Exemplary embodiment 5 | 0.980 | 0.020 | 0.955 | 0.045 | 0 | 1.0020 | 0.150 | 0.280 | 0 | 0.0330 | 0.0170 | 0.0500 | 1200 |
| Exemplary embodiment 6 | 0.940 | 0.060 | 0.955 | 0.045 | 0 | 1.0020 | 0.150 | 0.280 | 0 | 0.0330 | 0.0170 | 0.0500 | 1200 |
| Exemplary embodiment 7 | 0.970 | 0.030 | 0.962 | 0.038 | 0 | 1.0020 | 0.150 | 0.280 | 0 | 0.0330 | 0.0170 | 0.0500 | 1200 |
| Exemplary embodiment 8 | 0.920 | 0.080 | 0.962 | 0.038 | 0 | 1.0020 | 0.150 | 0.280 | 0 | 0.0330 | 0.0170 | 0.0500 | 1200 |
| Exemplary embodiment 9 | 0.950 | 0.050 | 0.970 | 0.030 | 0 | 1.0020 | 0.150 | 0.280 | 0 | 0.0330 | 0.0170 | 0.0500 | 1200 |
| Exemplary embodiment 10 | 0.970 | 0.030 | 0.979 | 0.021 | 0 | 1.0020 | 0.150 | 0.280 | 0 | 0.0330 | 0.0170 | 0.0500 | 1200 |
| Exemplary embodiment 11 | 0.920 | 0.080 | 0.979 | 0.021 | 0 | 1.0020 | 0.150 | 0.280 | 0 | 0.0330 | 0.0170 | 0.0500 | 1200 |
| Exemplary embodiment 12 | 1.000 | 0 | 0.987 | 0.013 | 0 | 1.0020 | 0.150 | 0.280 | 0 | 0.0330 | 0.0170 | 0.0500 | 1200 |
| Exemplary embodiment 13 | 0.980 | 0.020 | 0.987 | 0.013 | 0 | 1.0020 | 0.150 | 0.280 | 0 | 0.0330 | 0.0170 | 0.0500 | 1200 |
| Exemplary embodiment 14 | 0.940 | 0.060 | 0.987 | 0.013 | 0 | 1.0020 | 0.150 | 0.280 | 0 | 0.0330 | 0.0170 | 0.0500 | 1200 |
| Exemplary embodiment 15 | 0.920 | 0.080 | 0.987 | 0.013 | 0 | 1.0020 | 0.150 | 0.280 | 0 | 0.0330 | 0.0170 | 0.0500 | 1200 |
| Exemplary embodiment 16 | 1.000 | 0 | 0.930 | 0.060 | 0.010 | 1.0020 | 0.150 | 0.280 | 0 | 0.0330 | 0.0170 | 0.0500 | 1200 |
| Exemplary embodiment 17 | 0.980 | 0.020 | 0.930 | 0.060 | 0.010 | 1.0020 | 0.150 | 0.280 | 0 | 0.0330 | 0.0170 | 0.0500 | 1200 |
| Exemplary embodiment 18 | 0.920 | 0.080 | 0.930 | 0.060 | 0.010 | 1.0020 | 0.150 | 0.280 | 0 | 0.0330 | 0.0170 | 0.0500 | 1200 |
| Exemplary embodiment 19 | 0.970 | 0.030 | 0.952 | 0.038 | 0.010 | 1.0020 | 0.150 | 0.280 | 0 | 0.0330 | 0.0170 | 0.0500 | 1200 |
| Exemplary embodiment 20 | 0.920 | 0.080 | 0.952 | 0.038 | 0.010 | 1.0020 | 0.150 | 0.280 | 0 | 0.0330 | 0.0170 | 0.0500 | 1200 |
| Exemplary embodiment 21 | 0.950 | 0.050 | 0.960 | 0.030 | 0.010 | 1.0020 | 0.150 | 0.280 | 0 | 0.0330 | 0.0170 | 0.0500 | 1200 |
| Exemplary embodiment 22 | 0.970 | 0.030 | 0.969 | 0.021 | 0.010 | 1.0020 | 0.150 | 0.280 | 0 | 0.0330 | 0.0170 | 0.0500 | 1200 |
| Exemplary embodiment 23 | 1.000 | 0 | 0.977 | 0.013 | 0.010 | 1.0020 | 0.150 | 0.280 | 0 | 0.0330 | 0.0170 | 0.0500 | 1200 |
| Exemplary embodiment 24 | 0.980 | 0.020 | 0.977 | 0.013 | 0.010 | 1.0020 | 0.150 | 0.280 | 0 | 0.0330 | 0.0170 | 0.0500 | 1200 |
| Exemplary embodiment 25 | 0.950 | 0.050 | 0.940 | 0.030 | 0.030 | 1.0020 | 0.150 | 0.280 | 0 | 0.0330 | 0.0170 | 0.0500 | 1250 |
| Exemplary embodiment 26 | 0.920 | 0.080 | 0.922 | 0.038 | 0.040 | 1.0020 | 0.150 | 0.280 | 0 | 0.0330 | 0.0170 | 0.0500 | 1250 |
| Exemplary embodiment 27 | 0.950 | 0.050 | 0.930 | 0.030 | 0.040 | 1.0020 | 0.150 | 0.280 | 0 | 0.0330 | 0.0170 | 0.0500 | 1250 |
| Exemplary embodiment 28 | 0.970 | 0.030 | 0.939 | 0.021 | 0.040 | 1.0020 | 0.150 | 0.280 | 0 | 0.0330 | 0.0170 | 0.0500 | 1250 |
| Exemplary embodiment 29 | 0.920 | 0.080 | 0.939 | 0.021 | 0.040 | 1.0020 | 0.150 | 0.280 | 0 | 0.0330 | 0.0170 | 0.0500 | 1250 |
| Exemplary embodiment 30 | 0.920 | 0.080 | 0.947 | 0.013 | 0.040 | 1.0020 | 0.150 | 0.280 | 0 | 0.0330 | 0.0170 | 0.0500 | 1250 |
| Exemplary embodiment 31 | 0.920 | 0.080 | 0.987 | 0.013 | 0 | 1.0020 | 0.150 | 0.280 | 0 | 0.0330 | 0.0170 | 0.0500 | 1150 |
| Exemplary embodiment 32 | 0.920 | 0.080 | 0.987 | 0.013 | 0 | 1.0020 | 0.150 | 0.280 | 0 | 0.0330 | 0.0170 | 0.0500 | 1250 |
| Exemplary embodiment 33 | 0.920 | 0.080 | 0.987 | 0.013 | 0 | 1.0020 | 0.150 | 0.280 | 0 | 0.0330 | 0.0170 | 0.0500 | 1300 |
| Exemplary embodiment 34 | 0.964 | 0.036 | 0.967 | 0.033 | 0 | 0.9860 | 0.150 | 0.280 | 0 | 0.0330 | 0.0170 | 0.0500 | 1200 |
| Exemplary embodiment 35 | 0.964 | 0.036 | 0.967 | 0.033 | 0 | 1.0200 | 0.150 | 0.280 | 0 | 0.0330 | 0.0170 | 0.0500 | 1300 |
| Exemplary embodiment 36 | 0.964 | 0.036 | 0.967 | 0.033 | 0 | 0.9950 | 0.040 | 0.280 | 0 | 0.0330 | 0.0170 | 0.0500 | 1200 |
| Exemplary embodiment 37 | 0.964 | 0.036 | 0.967 | 0.033 | 0 | 1.0050 | 0.280 | 0.280 | 0 | 0.0330 | 0.0170 | 0.0500 | 1200 |
| Exemplary embodiment 38 | 0.964 | 0.036 | 0.967 | 0.033 | 0 | 1.0100 | 0.400 | 0.280 | 0 | 0.0330 | 0.0170 | 0.0500 | 1200 |
| Exemplary embodiment 39 | 0.964 | 0.036 | 0.967 | 0.033 | 0 | 1.0020 | 0.150 | 0.042 | 0 | 0.0330 | 0.0170 | 0.0500 | 1200 |
| Exemplary embodiment 40 | 0.964 | 0.036 | 0.967 | 0.033 | 0 | 1.0020 | 0.150 | 0.100 | 0 | 0.0330 | 0.0170 | 0.0500 | 1200 |
| Exemplary embodiment 41 | 0.964 | 0.036 | 0.967 | 0.033 | 0 | 1.0020 | 0.150 | 0.160 | 0 | 0.0330 | 0.0170 | 0.0500 | 1200 |
| Exemplary embodiment 42 | 0.964 | 0.036 | 0.967 | 0.033 | 0 | 1.0020 | 0.150 | 0.220 | 0 | 0.0330 | 0.0170 | 0.0500 | 1200 |
| Exemplary embodiment 43 | 0.964 | 0.036 | 0.967 | 0.033 | 0 | 1.0020 | 0.150 | 0.360 | 0 | 0.0330 | 0.0170 | 0.0500 | 1200 |
| Exemplary embodiment 44 | 0.964 | 0.036 | 0.967 | 0.033 | 0 | 1.0020 | 0.150 | 0.480 | 0 | 0.0330 | 0.0170 | 0.0500 | 1200 |
| Exemplary embodiment 45 | 0.964 | 0.036 | 0.967 | 0.033 | 0 | 1.0020 | 0.150 | 0.640 | 0 | 0.0330 | 0.0170 | 0.0500 | 1200 |
| Exemplary embodiment 46 | 0.964 | 0.036 | 0.967 | 0.033 | 0 | 1.0020 | 0.150 | 0.850 | 0 | 0.0330 | 0.0170 | 0.0500 | 1200 |
| Exemplary embodiment 47 | 0.950 | 0.050 | 0.960 | 0.030 | 0.010 | 1.0020 | 0.150 | 0.042 | 0 | 0.0330 | 0.0170 | 0.0500 | 1200 |
| Exemplary embodiment 48 | 0.950 | 0.050 | 0.960 | 0.030 | 0.010 | 1.0020 | 0.150 | 0.850 | 0 | 0.0330 | 0.0170 | 0.0500 | 1200 |
| Exemplary embodiment 49 | 0.950 | 0.050 | 0.930 | 0.030 | 0.040 | 1.0020 | 0.150 | 0.042 | 0 | 0.0330 | 0.0170 | 0.0500 | 1250 |
| Exemplary embodiment 50 | 0.950 | 0.050 | 0.930 | 0.030 | 0.040 | 1.0020 | 0.150 | 0.850 | 0 | 0.0330 | 0.0170 | 0.0500 | 1250 |
| Exemplary embodiment 51 | 0.964 | 0.036 | 0.967 | 0.033 | 0 | 1.0020 | 0.150 | 0.280 | 0.014 | 0.0330 | 0.0170 | 0.0500 | 1180 |
| Exemplary embodiment 52 | 0.964 | 0.036 | 0.967 | 0.033 | 0 | 1.0020 | 0.150 | 0.280 | 0.028 | 0.0330 | 0.0170 | 0.0500 | 1180 |
| Exemplary embodiment 53 | 0.950 | 0.050 | 0.960 | 0.030 | 0.010 | 1.0020 | 0.150 | 0.280 | 0.014 | 0.0330 | 0.0170 | 0.0500 | 1180 |
| Exemplary embodiment 54 | 0.950 | 0.050 | 0.960 | 0.030 | 0.010 | 1.0020 | 0.150 | 0.280 | 0.028 | 0.0330 | 0.0170 | 0.0500 | 1180 |
| Exemplary embodiment 55 | 0.950 | 0.050 | 0.930 | 0.030 | 0.040 | 1.0020 | 0.150 | 0.280 | 0.014 | 0.0330 | 0.0170 | 0.0500 | 1230 |
| Exemplary embodiment 56 | 0.950 | 0.050 | 0.930 | 0.030 | 0.040 | 1.0020 | 0.150 | 0.280 | 0.028 | 0.0330 | 0.0170 | 0.0500 | 1230 |
| Exemplary embodiment 57 | 0.964 | 0.036 | 0.967 | 0.033 | 0 | 1.0020 | 0.150 | 0.280 | 0 | 0.0010 | 0 | 0.0010 | 1200 |
| Exemplary embodiment 58 | 0.964 | 0.036 | 0.967 | 0.033 | 0 | 1.0020 | 0.150 | 0.280 | 0 | 4.0000 | 0 | 4.0000 | 1200 |
| Exemplary embodiment 59 | 0.964 | 0.036 | 0.967 | 0.033 | 0 | 1.0020 | 0.150 | 0.280 | 0 | 0 | 0.0010 | 0.0010 | 1200 |
| Exemplary embodiment 60 | 0.964 | 0.036 | 0.967 | 0.033 | 0 | 1.0020 | 0.150 | 0.280 | 0 | 0 | 4.0000 | 4.0000 | 1200 |
| Exemplary embodiment 61 | 0.964 | 0.036 | 0.967 | 0.033 | 0 | 1.0020 | 0.150 | 0.280 | 0 | 0.0005 | 0.0005 | 0.0010 | 1200 |
| Exemplary embodiment 62 | 0.964 | 0.036 | 0.967 | 0.033 | 0 | 1.0020 | 0.150 | 0.280 | 0 | 0.0015 | 0.0015 | 0.0030 | 1200 |
| Exemplary embodiment 63 | 0.964 | 0.036 | 0.967 | 0.033 | 0 | 1.0020 | 0.150 | 0.280 | 0 | 0.0250 | 0.0066 | 0.0316 | 1200 |
| Exemplary embodiment 64 | 0.964 | 0.036 | 0.967 | 0.033 | 0 | 1.0020 | 0.150 | 0.280 | 0 | 1.0000 | 1.0000 | 2.0000 | 1200 |
| Exemplary embodiment 65 | 0.964 | 0.036 | 0.967 | 0.033 | 0 | 1.0020 | 0.150 | 0.280 | 0 | 2.0000 | 2.0000 | 4.0000 | 1200 |
| Exemplary embodiment 66 | 0.964 | 0.036 | 0.967 | 0.033 | 0 | 1.0020 | 0.150 | 0.280 | 0 | 0 | 0 | 0 | 1300 |
| Exemplary embodiment 67 | 1.000 | 0 | 0.940 | 0.060 | 0 | 1.0020 | 0.150 | 0.280 | 0 | 0 | 0 | 0 | 1300 |
| Exemplary embodiment 68 | 0.980 | 0.020 | 0.940 | 0.060 | 0 | 1.0020 | 0.150 | 0.280 | 0 | 0 | 0 | 0 | 1300 |
| Exemplary embodiment 69 | 0.920 | 0.080 | 0.940 | 0.060 | 0 | 1.0020 | 0.150 | 0.280 | 0 | 0 | 0 | 0 | 1300 |
| Exemplary embodiment 70 | 0.980 | 0.020 | 0.955 | 0.045 | 0 | 1.0020 | 0.150 | 0.280 | 0 | 0 | 0 | 0 | 1300 |
| Exemplary embodiment 71 | 0.940 | 0.060 | 0.955 | 0.045 | 0 | 1.0020 | 0.150 | 0.280 | 0 | 0 | 0 | 0 | 1300 |

TABLE 1-continued

| | Main component | | | | | | First auxiliary component | Second auxiliary component | | Third auxiliary component | | | Maximum |
|---|---|---|---|---|---|---|---|---|---|---|---|---|---|
| | | | Ti | | | | | | | | | | |
| | Ba 1−x | Ca x | 1−y−z | Sn y | Zr z | A/B a | Mn Parts by weight | Bi Parts by weight | Li Parts by weight | Si Parts by weight | B Parts by weight | Total Parts by weight | temperature $T_{max}$ [° C.] |
| Exemplary embodiment 72 | 0.970 | 0.030 | 0.962 | 0.038 | 0 | 1.0020 | 0.150 | 0.280 | 0 | 0 | 0 | 0 | 1300 |
| Exemplary embodiment 73 | 0.920 | 0.080 | 0.962 | 0.038 | 0 | 1.0020 | 0.150 | 0.280 | 0 | 0 | 0 | 0 | 1300 |
| Exemplary embodiment 74 | 0.950 | 0.050 | 0.970 | 0.030 | 0 | 1.0020 | 0.150 | 0.280 | 0 | 0 | 0 | 0 | 1300 |
| Exemplary embodiment 75 | 0.970 | 0.030 | 0.979 | 0.021 | 0 | 1.0020 | 0.150 | 0.280 | 0 | 0 | 0 | 0 | 1300 |
| Exemplary embodiment 76 | 0.920 | 0.080 | 0.979 | 0.021 | 0 | 1.0020 | 0.150 | 0.280 | 0 | 0 | 0 | 0 | 1300 |
| Exemplary embodiment 77 | 1.000 | 0 | 0.987 | 0.013 | 0 | 1.0020 | 0.150 | 0.280 | 0 | 0 | 0 | 0 | 1300 |
| Exemplary embodiment 78 | 0.980 | 0.020 | 0.987 | 0.013 | 0 | 1.0020 | 0.150 | 0.280 | 0 | 0 | 0 | 0 | 1300 |
| Exemplary embodiment 79 | 0.940 | 0.060 | 0.987 | 0.013 | 0 | 1.0020 | 0.150 | 0.280 | 0 | 0 | 0 | 0 | 1300 |
| Exemplary embodiment 80 | 0.920 | 0.080 | 0.987 | 0.013 | 0 | 1.0020 | 0.150 | 0.280 | 0 | 0 | 0 | 0 | 1300 |
| Exemplary embodiment 81 | 0.950 | 0.050 | 0.960 | 0.030 | 0.010 | 1.0020 | 0.150 | 0.280 | 0 | 0 | 0 | 0 | 1320 |
| Exemplary embodiment 82 | 0.950 | 0.050 | 0.930 | 0.030 | 0.040 | 1.0020 | 0.150 | 0.280 | 0 | 0 | 0 | 0 | 1380 |
| Comparative example 1 | 1.000 | 0 | 0.930 | 0.070 | 0 | 1.0020 | 0.150 | 0.280 | 0 | 0.0330 | 0.0170 | 0.0500 | 1200 |
| Comparative example 2 | 0.900 | 0.100 | 0.930 | 0.070 | 0 | 1.0020 | 0.150 | 0.280 | 0 | 0.0330 | 0.0170 | 0.0500 | 1200 |
| Comparative example 3 | 0.900 | 0.100 | 0.970 | 0.030 | 0 | 1.0020 | 0.150 | 0.280 | 0 | 0.0330 | 0.0170 | 0.0500 | 1200 |
| Comparative example 4 | 1.000 | 0 | 0.995 | 0.005 | 0 | 1.0020 | 0.150 | 0.280 | 0 | 0.0330 | 0.0170 | 0.0500 | 1200 |
| Comparative example 5 | 0.900 | 0.100 | 0.995 | 0.005 | 0 | 1.0020 | 0.150 | 0.280 | 0 | 0.0330 | 0.0170 | 0.0500 | 1200 |
| Comparative example 6 | 1.000 | 0 | 0.920 | 0.070 | 0.010 | 1.0020 | 0.150 | 0.280 | 0 | 0.0330 | 0.0170 | 0.0500 | 1200 |
| Comparative example 7 | 0.900 | 0.100 | 0.920 | 0.070 | 0.010 | 1.0020 | 0.150 | 0.280 | 0 | 0.0330 | 0.0170 | 0.0500 | 1200 |
| Comparative example 8 | 0.900 | 0.100 | 0.960 | 0.030 | 0.010 | 1.0020 | 0.150 | 0.280 | 0 | 0.0330 | 0.0170 | 0.0500 | 1200 |
| Comparative example 9 | 1.000 | 0 | 0.985 | 0.005 | 0.010 | 1.0020 | 0.150 | 0.280 | 0 | 0.0330 | 0.0170 | 0.0500 | 1200 |
| Comparative example 10 | 0.900 | 0.100 | 0.985 | 0.005 | 0.010 | 1.0020 | 0.150 | 0.280 | 0 | 0.0330 | 0.0170 | 0.0500 | 1200 |
| Comparative example 11 | 1.000 | 0 | 0.890 | 0.070 | 0.040 | 1.0020 | 0.150 | 0.280 | 0 | 0.0330 | 0.0170 | 0.0500 | 1250 |
| Comparative example 12 | 0.900 | 0.100 | 0.890 | 0.070 | 0.040 | 1.0020 | 0.150 | 0.280 | 0 | 0.0330 | 0.0170 | 0.0500 | 1250 |
| Comparative example 13 | 0.900 | 0.100 | 0.930 | 0.030 | 0.040 | 1.0020 | 0.150 | 0.280 | 0 | 0.0330 | 0.0170 | 0.0500 | 1250 |
| Comparative example 14 | 1.000 | 0 | 0.955 | 0.005 | 0.040 | 1.0020 | 0.150 | 0.280 | 0 | 0.0330 | 0.0170 | 0.0500 | 1250 |
| Comparative example 15 | 0.900 | 0.100 | 0.955 | 0.005 | 0.040 | 1.0020 | 0.150 | 0.280 | 0 | 0.0330 | 0.0170 | 0.0500 | 1250 |
| Comparative example 16 | 0.950 | 0.050 | 0.920 | 0.030 | 0.050 | 1.0020 | 0.150 | 0.280 | 0 | 0.0330 | 0.0170 | 0.0500 | 1250 |
| Comparative example 17 | 0.964 | 0.036 | 0.967 | 0.033 | 0 | 0.9850 | 0.150 | 0.280 | 0 | 0.0330 | 0.0170 | 0.0500 | 1200 |
| Comparative example 18 | 0.964 | 0.036 | 0.967 | 0.033 | 0 | 1.0210 | 0.150 | 0.280 | 0 | 0.0330 | 0.0170 | 0.0500 | 1300 |
| Comparative example 19 | 0.964 | 0.036 | 0.967 | 0.033 | 0 | 0.9930 | 0.030 | 0.280 | 0 | 0.0330 | 0.0170 | 0.0500 | 1200 |
| Comparative example 20 | 0.964 | 0.036 | 0.967 | 0.033 | 0 | 1.0110 | 0.420 | 0.280 | 0 | 0.0330 | 0.0170 | 0.0500 | 1200 |
| Comparative example 21 | 0.964 | 0.036 | 0.967 | 0.033 | 0 | 1.0020 | 0.150 | 0.022 | 0 | 0.0330 | 0.0170 | 0.0500 | 1200 |
| Comparative example 22 | 0.964 | 0.036 | 0.967 | 0.033 | 0 | 1.0020 | 0.150 | 0.960 | 0 | 0.0330 | 0.0170 | 0.0500 | 1200 |
| Comparative example 23 | 0.964 | 0.036 | 0.967 | 0.033 | 0 | 1.0020 | 0.150 | 0.280 | 0.036 | 0.0330 | 0.0170 | 0.0500 | 1200 |
| Comparative example 24 | 0.900 | 0.100 | 1.000 | 0 | 0 | 1.0000 | 0.144 | 0 | 0 | 0 | 0 | 0 | 1300 |

TABLE 2

| | Average equivalent circular diameter [μm] | Relative density [%] |
|---|---|---|
| Exemplary embodiment 1 | 0.96 | 99.1 |
| Exemplary embodiment 2 | 1.25 | 93.9 |
| Exemplary embodiment 3 | 1.08 | 95.9 |
| Exemplary embodiment 4 | 1.34 | 95.5 |
| Exemplary embodiment 5 | 1.43 | 96.8 |
| Exemplary embodiment 6 | 1.03 | 96.8 |
| Exemplary embodiment 7 | 1.01 | 98.7 |
| Exemplary embodiment 8 | 1.31 | 97.6 |
| Exemplary embodiment 9 | 1.02 | 98.5 |
| Exemplary embodiment 10 | 0.98 | 98.0 |
| Exemplary embodiment 11 | 1.10 | 97.2 |
| Exemplary embodiment 12 | 1.24 | 94.1 |
| Exemplary embodiment 13 | 1.18 | 96.6 |
| Exemplary embodiment 14 | 1.22 | 96.7 |
| Exemplary embodiment 15 | 1.29 | 95.8 |
| Exemplary embodiment 16 | 1.03 | 93.2 |
| Exemplary embodiment 17 | 1.04 | 95.3 |
| Exemplary embodiment 18 | 1.20 | 95.9 |
| Exemplary embodiment 19 | 0.90 | 98.5 |
| Exemplary embodiment 20 | 0.96 | 98.1 |
| Exemplary embodiment 21 | 0.97 | 98.8 |
| Exemplary embodiment 22 | 1.04 | 97.4 |
| Exemplary embodiment 23 | 1.03 | 94.9 |
| Exemplary embodiment 24 | 1.12 | 96.5 |
| Exemplary embodiment 25 | 0.93 | 97.9 |
| Exemplary embodiment 26 | 0.99 | 97.1 |
| Exemplary embodiment 27 | 1.02 | 97.8 |
| Exemplary embodiment 28 | 1.02 | 97.3 |
| Exemplary embodiment 29 | 0.95 | 97.3 |
| Exemplary embodiment 30 | 1.04 | 93.7 |
| Exemplary embodiment 31 | 0.52 | 91.7 |
| Exemplary embodiment 32 | 1.82 | 96.0 |
| Exemplary embodiment 33 | 4.46 | 98.0 |
| Exemplary embodiment 34 | 9.68 | 97.4 |
| Exemplary embodiment 35 | 0.69 | 94.9 |
| Exemplary embodiment 36 | 1.19 | 97.3 |
| Exemplary embodiment 37 | 1.12 | 98.3 |
| Exemplary embodiment 38 | 2.20 | 97.0 |
| Exemplary embodiment 39 | 0.99 | 97.1 |
| Exemplary embodiment 40 | 1.20 | 98.0 |
| Exemplary embodiment 41 | 1.08 | 98.0 |
| Exemplary embodiment 42 | 1.34 | 98.4 |
| Exemplary embodiment 43 | 1.39 | 98.5 |
| Exemplary embodiment 44 | 1.14 | 98.3 |
| Exemplary embodiment 45 | 1.01 | 97.5 |
| Exemplary embodiment 46 | 1.06 | 96.9 |
| Exemplary embodiment 47 | 1.02 | 98.1 |
| Exemplary embodiment 48 | 1.08 | 96.9 |
| Exemplary embodiment 49 | 1.03 | 97.8 |
| Exemplary embodiment 50 | 1.01 | 96.8 |
| Exemplary embodiment 51 | 0.97 | 97.0 |
| Exemplary embodiment 52 | 0.97 | 96.0 |
| Exemplary embodiment 53 | 1.02 | 97.1 |
| Exemplary embodiment 54 | 1.04 | 96.1 |

TABLE 2-continued

| | Average equivalent circular diameter [μm] | Relative density [%] |
|---|---|---|
| Exemplary embodiment 55 | 0.98 | 97.2 |
| Exemplary embodiment 56 | 1.17 | 96.3 |
| Exemplary embodiment 57 | 0.89 | 96.7 |
| Exemplary embodiment 58 | 1.09 | 97.3 |
| Exemplary embodiment 59 | 0.88 | 96.6 |
| Exemplary embodiment 60 | 1.01 | 96.9 |
| Exemplary embodiment 61 | 0.85 | 96.9 |
| Exemplary embodiment 62 | 0.86 | 98.1 |
| Exemplary embodiment 63 | 1.04 | 98.3 |
| Exemplary embodiment 64 | 1.20 | 98.2 |
| Exemplary embodiment 65 | 1.12 | 97.3 |
| Exemplary embodiment 66 | 2.01 | 99.0 |
| Exemplary embodiment 67 | 1.92 | 93.6 |
| Exemplary embodiment 68 | 1.87 | 95.4 |
| Exemplary embodiment 69 | 2.01 | 95.4 |
| Exemplary embodiment 70 | 2.22 | 96.7 |
| Exemplary embodiment 71 | 2.03 | 96.5 |
| Exemplary embodiment 72 | 1.76 | 98.6 |
| Exemplary embodiment 73 | 1.88 | 97.3 |
| Exemplary embodiment 74 | 1.67 | 98.0 |
| Exemplary embodiment 75 | 1.65 | 98.0 |
| Exemplary embodiment 76 | 1.66 | 97.2 |
| Exemplary embodiment 77 | 1.91 | 94.0 |
| Exemplary embodiment 78 | 1.82 | 96.6 |
| Exemplary embodiment 79 | 2.03 | 96.7 |
| Exemplary embodiment 80 | 2.10 | 95.6 |
| Exemplary embodiment 81 | 2.69 | 96.2 |
| Exemplary embodiment 82 | 3.64 | 95.8 |
| Comparative example 1 | 0.99 | 93.6 |
| Comparative example 2 | 1.02 | 95.6 |
| Comparative example 3 | 1.06 | 95.3 |
| Comparative example 4 | 1.20 | 93.7 |
| Comparative example 5 | 1.03 | 95.1 |
| Comparative example 6 | 0.98 | 93.7 |
| Comparative example 7 | 0.94 | 95.6 |
| Comparative example 8 | 1.12 | 95.5 |
| Comparative example 9 | 1.19 | 93.9 |
| Comparative example 10 | 1.20 | 94.0 |
| Comparative example 11 | 1.01 | 94.0 |
| Comparative example 12 | 1.02 | 95.8 |
| Comparative example 13 | 1.17 | 95.3 |
| Comparative example 14 | 1.18 | 93.6 |
| Comparative example 15 | 1.06 | 93.6 |
| Comparative example 16 | 0.82 | 93.8 |
| Comparative example 17 | 16.35 | 94.6 |
| Comparative example 18 | 0.43 | 89.3 |
| Comparative example 19 | 1.05 | 95.8 |
| Comparative example 20 | 1.15 | 97.8 |
| Comparative example 21 | 1.07 | 98.2 |
| Comparative example 22 | 0.92 | 96.4 |
| Comparative example 23 | 0.86 | 94.7 |
| Comparative example 24 | 3.93 | 97.0 |

Manufacture of Piezoelectric Element

A piezoelectric element according to an exemplary embodiment of the present invention was then manufactured.

Piezoelectric Elements according to Exemplary Embodiments 1 to 82

Piezoelectric elements were manufactured using the piezoelectric materials according to Exemplary Embodiments 1 to 82.

A gold electrode having a thickness of 400 nm was formed on the front and back sides of a discoidal ceramic by DC sputtering. A titanium film having a thickness of 30 nm was formed as an adhesion layer between the electrodes and the ceramic. The ceramic having the electrodes was cut into a 10 mm×2.5 mm×0.5 mm plate-like piezoelectric element.

A 1.0 kV/mm electric field was applied to the piezoelectric element on a hot plate at a temperature in the range of 60° C. to 150° C. for 30 minutes to perform polarization treatment.

Piezoelectric Elements According to Comparative Examples 1 to 24

In the same manner as in Exemplary Embodiments 1 to 82, comparative elements were manufactured using the comparative metal oxide materials according to Comparative Examples 1 to 24 and were subjected to polarization treatment.

Characterization of Piezoelectric Element

The piezoelectric constant $d_{31}$ and the mechanical quality factor Qm in a device operation temperature range (−30° C. to 50° C.) were measured in the piezoelectric elements manufactured using the piezoelectric materials according to Exemplary Embodiments 1 to 82 and the comparative elements manufactured using the metal oxide materials according to Comparative Examples 1 to 24 after polarization treatment. Table 3 shows the results. X in the table means that the comparative element had too low resistivity to perform sufficient polarization treatment, and the corresponding evaluation data was not available.

The environmental temperature was increased from 30° C. to 50° C. in steps of 5° C., was decreased to −30° C. in steps of 5° C., and was increased to 30° C. in steps of 5° C. with a thermostat. The thermostat temperature was held at each of the temperatures for 10 minutes or more before measurement. The piezoelectric constant $d_{31}$ and the mechanical quality factor Qm were determined using a resonance-antiresonance method. Table 3 shows the mechanical quality factor Qm at −30° C. and the minimum value of the mechanical quality factor Qm and the minimum value of the absolute value $|d_{31}|$ of the piezoelectric constant $d_{31}$ at a temperature in the range of −30° C. to 50° C.

A low piezoelectric constant results in a high electric field for device operation and is not suitable for device operation. The piezoelectric constant $|d_{31}|$ is preferably 50 [pm/V] or more, more preferably 60 [pm/V] or more, still more preferably 70 [pm/V] or more.

Resistivity was measured as a measure of the insulation property. The resistivity of non-polarized piezoelectric elements was measured at room temperature (25° C.). Twenty seconds after a direct-current voltage of 10 V was applied between two electrodes of a piezoelectric element, the resistivity of the piezoelectric element was determined from the leakage current. Table 3 shows the results. The piezoelectric material and the piezoelectric element have a practically sufficient insulation property when the resistivity is $1 \times 10^9$ Ω·cm or more, preferably $50 \times 10^9$ Ω·cm or more. The resistivity [G Ω·cm] in the table represents [$10^9$ Ω·cm].

Evaluation of High-Temperature Durability of Piezoelectric Element

The piezoelectric elements according to Exemplary Embodiments 2, 5, 7, 9, 21, and 27 and the comparative elements according to Comparative Examples 1, 2, 6, 7, 11, and 12 were subjected to a high-temperature durability test in a thermostat at 85° C. for 24 hours. The minimum value of the absolute value $|d_{31}|$ of the piezoelectric constant $d_{31}$ at a temperature in the range of −30° C. to 50° C. was determined before and after the high-temperature durability test. Table 4 shows the variation ratio of the minimum value of $|d_{31}|$ due to the high-temperature durability test.

Measurement of Curie Temperature of Piezoelectric Element

Figure 16:
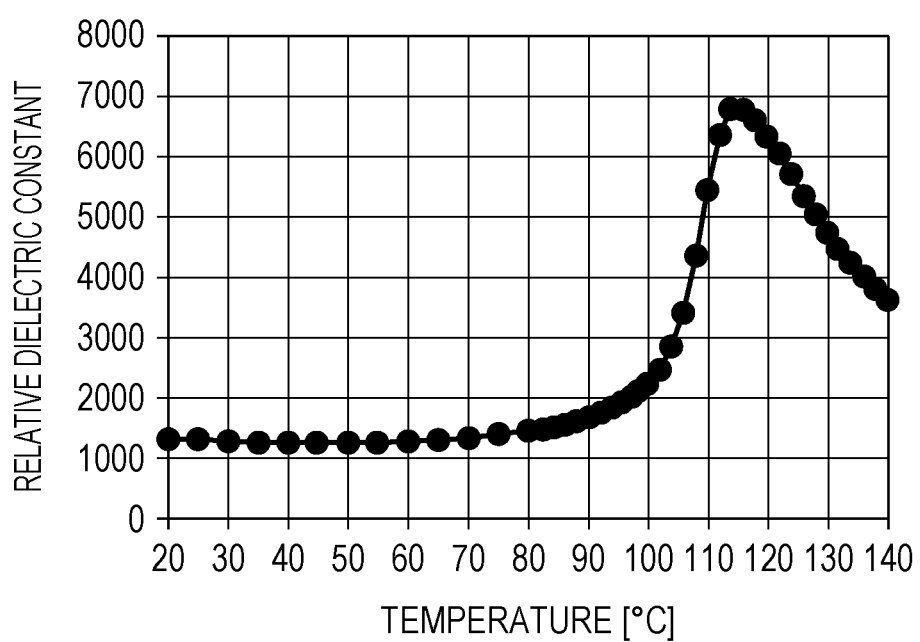
FIG. 16 is a graph of the temperature dependence of the relative dielectric constant of a piezoelectric element according to Exemplary Embodiment 9 of the present invention.

The piezoelectric elements according to Exemplary Embodiments 2, 5, 7, 9, 21, and 27 and the comparative elements according to Comparative Examples 1, 2, 6, 7, 11, and 12 were subjected to measurements of the Curie temperature Tc. The Curie temperature Tc was determined from the temperature at which the relative dielectric constant reaches its maximum in a very small alternating electric field. The environmental temperature was increased from 20° C. to 80° C. in steps of 5° C. and to 140° C. in steps of 2° C. with a thermostat. The thermostat temperature was held at each of the temperatures for 10 minutes or more before measurement. Table 4 shows the results. FIG. 16 shows the change of relative dielectric constant of the piezoelectric element according to Exemplary Embodiment 9 as a function of environmental temperature.

TABLE 3

|  | Qm at −30° C. | Minimum Qm at −30° C. to 50° C. | Minimum $|d_{31}|$ at −30° C. to 50° C. [pm/V] | Resistivity at 25° C. [GΩ · cm] |
|---|---|---|---|---|
| Exemplary embodiment 1 | 756 | 743 | 69.4 | 60 |
| Exemplary embodiment 2 | 468 | 460 | 60.5 | 51 |
| Exemplary embodiment 3 | 511 | 508 | 79.2 | 54 |
| Exemplary embodiment 4 | 505 | 505 | 62.1 | 149 |
| Exemplary embodiment 5 | 587 | 581 | 74.1 | 55 |
| Exemplary embodiment 6 | 612 | 612 | 63.3 | 131 |
| Exemplary embodiment 7 | 708 | 699 | 73.5 | 59 |
| Exemplary embodiment 8 | 710 | 710 | 60.5 | 137 |
| Exemplary embodiment 9 | 775 | 775 | 65.1 | 76 |
| Exemplary embodiment 10 | 765 | 752 | 62.0 | 58 |
| Exemplary embodiment 11 | 754 | 754 | 60.1 | 133 |
| Exemplary embodiment 12 | 480 | 472 | 59.3 | 52 |
| Exemplary embodiment 13 | 552 | 550 | 58.2 | 54 |
| Exemplary embodiment 14 | 817 | 817 | 54.6 | 132 |
| Exemplary embodiment 15 | 775 | 775 | 50.5 | 140 |
| Exemplary embodiment 16 | 466 | 457 | 60.2 | 52 |
| Exemplary embodiment 17 | 521 | 516 | 70.8 | 53 |
| Exemplary embodiment 18 | 509 | 504 | 64.9 | 147 |
| Exemplary embodiment 19 | 703 | 695 | 74.6 | 59 |
| Exemplary embodiment 20 | 705 | 705 | 66.5 | 130 |
| Exemplary embodiment 21 | 770 | 752 | 60.1 | 76 |
| Exemplary embodiment 22 | 766 | 760 | 63.8 | 59 |
| Exemplary embodiment 23 | 489 | 479 | 59.4 | 51 |
| Exemplary embodiment 24 | 549 | 538 | 58.9 | 55 |
| Exemplary embodiment 25 | 696 | 686 | 71.1 | 76 |
| Exemplary embodiment 26 | 606 | 605 | 64.9 | 136 |
| Exemplary embodiment 27 | 675 | 672 | 72.9 | 76 |
| Exemplary embodiment 28 | 685 | 667 | 71.1 | 54 |
| Exemplary embodiment 29 | 679 | 675 | 66.8 | 129 |
| Exemplary embodiment 30 | 622 | 622 | 59.7 | 132 |
| Exemplary embodiment 31 | 419 | 419 | 50.5 | 19 |
| Exemplary embodiment 32 | 776 | 776 | 57.7 | 139 |
| Exemplary embodiment 33 | 787 | 787 | 59.0 | 124 |
| Exemplary embodiment 34 | 788 | 788 | 56.7 | 86 |
| Exemplary embodiment 35 | 582 | 574 | 73.0 | 52 |
| Exemplary embodiment 36 | 411 | 411 | 75.5 | 50 |
| Exemplary embodiment 37 | 750 | 749 | 67.0 | 63 |
| Exemplary embodiment 38 | 636 | 630 | 51.8 | 70 |
| Exemplary embodiment 39 | 494 | 488 | 73.2 | 66 |
| Exemplary embodiment 40 | 567 | 563 | 71.9 | 66 |
| Exemplary embodiment 41 | 679 | 672 | 71.5 | 62 |
| Exemplary embodiment 42 | 765 | 761 | 70.6 | 63 |
| Exemplary embodiment 43 | 752 | 752 | 65.3 | 63 |
| Exemplary embodiment 44 | 730 | 730 | 62.0 | 61 |
| Exemplary embodiment 45 | 683 | 683 | 57.6 | 62 |
| Exemplary embodiment 46 | 672 | 672 | 53.1 | 57 |
| Exemplary embodiment 47 | 483 | 476 | 69.5 | 72 |
| Exemplary embodiment 48 | 630 | 630 | 58.3 | 70 |
| Exemplary embodiment 49 | 490 | 476 | 62.6 | 73 |
| Exemplary embodiment 50 | 578 | 578 | 58.2 | 70 |
| Exemplary embodiment 51 | 744 | 724 | 68.8 | 59 |
| Exemplary embodiment 52 | 676 | 658 | 68.1 | 54 |
| Exemplary embodiment 53 | 724 | 722 | 65.9 | 65 |
| Exemplary embodiment 54 | 636 | 636 | 63.8 | 62 |
| Exemplary embodiment 55 | 721 | 717 | 73.6 | 66 |
| Exemplary embodiment 56 | 618 | 617 | 70.9 | 58 |
| Exemplary embodiment 57 | 707 | 705 | 67.5 | 50 |
| Exemplary embodiment 58 | 598 | 587 | 56.4 | 71 |
| Exemplary embodiment 59 | 713 | 713 | 66.7 | 51 |
| Exemplary embodiment 60 | 565 | 552 | 50.5 | 74 |
| Exemplary embodiment 61 | 739 | 729 | 67.3 | 51 |
| Exemplary embodiment 62 | 728 | 727 | 66.8 | 54 |
| Exemplary embodiment 63 | 763 | 764 | 68.1 | 77 |
| Exemplary embodiment 64 | 758 | 748 | 61.4 | 73 |
| Exemplary embodiment 65 | 513 | 513 | 53.0 | 76 |
| Exemplary embodiment 66 | 790 | 788 | 70.3 | 30 |
| Exemplary embodiment 67 | 496 | 487 | 61.6 | 21 |
| Exemplary embodiment 68 | 521 | 514 | 82.4 | 22 |
| Exemplary embodiment 69 | 527 | 527 | 65.3 | 49 |
| Exemplary embodiment 70 | 589 | 579 | 75.1 | 25 |
| Exemplary embodiment 71 | 627 | 627 | 64.0 | 48 |
| Exemplary embodiment 72 | 738 | 730 | 73.9 | 29 |
| Exemplary embodiment 73 | 734 | 734 | 60.6 | 44 |
| Exemplary embodiment 74 | 791 | 791 | 66.3 | 48 |
| Exemplary embodiment 75 | 797 | 787 | 61.9 | 29 |
| Exemplary embodiment 76 | 799 | 799 | 60.1 | 43 |
| Exemplary embodiment 77 | 492 | 485 | 59.6 | 26 |
| Exemplary embodiment 78 | 578 | 571 | 58.6 | 26 |
| Exemplary embodiment 79 | 847 | 847 | 55.7 | 44 |
| Exemplary embodiment 80 | 819 | 819 | 52.0 | 39 |
| Exemplary embodiment 81 | 793 | 793 | 67.9 | 27 |
| Exemplary embodiment 82 | 764 | 755 | 80.6 | 23 |
| Comparative example 1 | 409 | 400 | 57.6 | 55 |
| Comparative example 2 | 432 | 432 | 39.2 | 132 |
| Comparative example 3 | 515 | 515 | 37.0 | 121 |
| Comparative example 4 | 442 | 432 | 29.6 | 53 |
| Comparative example 5 | 640 | 640 | 24.4 | 120 |
| Comparative example 6 | 321 | 319 | 58.4 | 54 |
| Comparative example 7 | 430 | 430 | 38.6 | 130 |
| Comparative example 8 | 499 | 499 | 37.3 | 121 |
| Comparative example 9 | 442 | 439 | 31.7 | 52 |
| Comparative example 10 | 612 | 612 | 23.5 | 119 |
| Comparative example 11 | 393 | 371 | 32.3 | 56 |
| Comparative example 12 | 430 | 427 | 39.2 | 138 |
| Comparative example 13 | 493 | 493 | 40.4 | 133 |
| Comparative example 14 | 432 | 424 | 39.2 | 52 |
| Comparative example 15 | 615 | 615 | 40.1 | 129 |
| Comparative example 16 | 245 | 236 | 72.3 | 119 |
| Comparative example 17 | 722 | 716 | 36.6 | 61 |
| Comparative example 18 | X | X | X | 0.6 |
| Comparative example 19 | 228 | 228 | 71.3 | 7 |
| Comparative example 20 | 699 | 672 | 33.8 | 59 |
| Comparative example 21 | 229 | 213 | 72.6 | 57 |
| Comparative example 22 | 818 | 818 | 20.2 | 31 |
| Comparative example 23 | 635 | 629 | 31.2 | 26 |
| Comparative example 24 | 234 | 234 | 29.6 | 26 |

TABLE 4

|  | Curie temperature Tc [° C.] | Minimum $|d_{31}|$ before high-temperature durability test [pm/V] | Minimum $|d_{31}|$ after high-temperature durability test [pm/V] | Variation ratio [%] |
|---|---|---|---|---|
| Exemplary embodiment 2 | 102 | 60.5 | 56.9 | −6.0 |
| Exemplary embodiment 5 | 106 | 74.1 | 70.1 | −5.4 |
| Exemplary embodiment 7 | 112 | 73.5 | 71.1 | −3.2 |
| Exemplary embodiment 9 | 116 | 65.1 | 63.7 | −2.2 |
| Exemplary embodiment 21 | 114 | 60.1 | 58.5 | −2.6 |
| Exemplary embodiment 27 | 106 | 72.9 | 71.0 | −2.6 |
| Comparative example 1 | 90 | 57.6 | 51.6 | −10.5 |
| Comparative example 2 | 88 | 39.2 | 35.0 | −10.6 |
| Comparative example 6 | 88 | 58.4 | 52.0 | −11.0 |
| Comparative example 7 | 88 | 38.6 | 34.5 | −10.7 |

TABLE 4-continued

|  | Curie temperature Tc [° C.] | Minimum $|d_{31}|$ before high-temperature durability test [pm/V] | Minimum $|d_{31}|$ after high-temperature durability test [pm/V] | Variation ratio [%] |
|---|---|---|---|---|
| Comparative example 11 | 80 | 32.3 | 27.5 | −14.8 |
| Comparative example 12 | 82 | 39.2 | 33.3 | −15.1 |

The results in Tables 3 and 4 will be described below.

In Comparative Examples 2, 3, 5, 7, 8, 10, 12, 13, 15, and 24, which had x of more than 0.080, the minimum value of $|d_{31}|$ in the device operation temperature range was less than 50 [pm/V], which was smaller than that of Exemplary Embodiments 1 to 82. In Exemplary Embodiments 1, 3 to 11, 13 to 15, 17 to 22, and 24 to 30, which had x of 0.020 or more and 0.080 or less, the minimum value of Qm in the device operation temperature range was 500 or more, which was higher than that in Exemplary Embodiments 2, 12, 16, and 23. Thus, Exemplary Embodiments 1, 3 to 11, 13 to 15, 17 to 22, and 24 to 30 are more suitable for piezoelectric elements.

In Comparative Examples 1, 2, 6, 7, 11, and 12, which had y of more than 0.060, the variation ratio of $|d_{31}|$ due to the high-temperature durability test was much more than −10%. Thus, Comparative Examples 1, 2, 6, 7, 11, and 12 had lower high-temperature durability than Exemplary Embodiments 2, 5, 7, 9, 21, and 27. This is probably because y of more than 0.060 resulted in a low Curie temperature. In Exemplary Embodiments 7, 9, 19, 21, and 27, which had y of 0.038 or less, the variation ratio of $|d_{31}|$ due to the high-temperature durability test was less than −5%. Thus, Exemplary Embodiments 7, 9, 19, 21, and 27 had higher high-temperature durability than Exemplary Embodiments 2 and 5. Thus, Exemplary Embodiments 7, 9, 19, 21, and 27 are more suitable for piezoelectric elements.

In Comparative Examples 4, 5, 9, 10, 14, 15, and 24, which had y of more than 0.013, the minimum value of $|d_{31}|$ in the device operation temperature range was less than 50 [pm/V], which was smaller than that in Exemplary Embodiments 1 to 82.

In Exemplary Embodiments 1, 7 to 11, 19 to 22, and 26 to 29, which had x of 0.03 or more and 0.08 or less and y of 0.021 or more and 0.038 or less, the minimum value of Qm was 600 or more, and the minimum value of $|d_{31}|$ was 60 [pm/V] or more. Thus, Exemplary Embodiments 1, 7 to 11, 19 to 22, and 26 to 29 had a particularly high mechanical quality factor and piezoelectric constant in the device operation temperature range.

Comparative Example 16, which had z of more than 0.040, had Qm of less than 400, which was lower than Qm in Exemplary Embodiments 1 to 82. Thus, the piezoelectric element according to Comparative Example 16 used as a resonance device consumed much power.

Comparative Example 17, which had a of less than 0.9860, had an average equivalent circular diameter of 16.35 μm, which was greater than the average equivalent circular diameters in Exemplary Embodiments 1 to 82, indicating the growth of abnormal grains. The mechanical strength of piezoelectric elements was measured in a three-point bending test with a tensile compression tester (trade name Tensilon RTC-1250A manufactured by Orientec Co., Ltd.). The piezoelectric element according to Comparative Example 17 had a mechanical strength of 20 MPa, which was much lower than the mechanical strength (40 MPa or more) of the piezoelectric elements according to Exemplary Embodiments 1 to 82.

Comparative Example 18, which had a of more than 1.0200, had excessively lower grain growth and a lower relative density than Exemplary Embodiments 1 to 82. Thus, the piezoelectric element according to Comparative Example 18 had low resistivity and was not subjected to sufficient polarization treatment.

Comparative Example 19, which had a Mn content of less than 0.040, had a minimum Qm of less than 400, which was lower than the minimum Qm in Exemplary Embodiments 1 to 82. Thus, the piezoelectric element according to Comparative Example 19 used as a resonance device consumed much power.

In Comparative Example 20, which had a Mn content of more than 0.400 parts by weight, the minimum value of $|d_{31}|$ was less than 50 [pm/V], which was lower than that in Exemplary Embodiments 1 to 82.

In Comparative Examples 21 and 24, which had a Bi content of less than 0.042 parts by weight (Comparative Example 24 contained no Bi), the Qm at −30° C. was much lower than 400, which was lower than that in Exemplary Embodiments 1 to 82. Thus, the piezoelectric elements according to Comparative Examples 21 and 24 used as resonance devices at −30° C. consumed much power.

In Comparative Example 22, which had a Bi content of more than 0.850 parts by weight, the minimum value of $|d_{31}|$ was less than 50 [pm/V], which was lower than that in Exemplary Embodiments 1 to 82. In Exemplary Embodiments 39 to 44, which had a Bi content of 0.48 parts by weight or less, the minimum value of $|d_{31}|$ was 60 [pm/V] or more, which was higher than that in Exemplary Embodiments 45 and 46, which had a Bi content of more than 0.48 parts by weight. Thus, Exemplary Embodiments 39 to 44 are more suitable for piezoelectric elements.

In Comparative Example 23, which had a Li content of more than 0.028 parts by weight, the minimum value of $|d_{31}|$ was less than 50 [pm/V], which was lower than that in Exemplary Embodiments 1 to 82.

Exemplary Embodiments 1 to 30 and 32 to 65, which contained the third auxiliary component, had a resistivity of $50 \times 10^9$ Ω·cm or more, which was higher than the resistivity in Examples 66 to 82, which did not contain the third auxiliary component. Thus, Exemplary Embodiments 1 to 30 and 32 to 65 are more suitable for piezoelectric elements.

Exemplary Embodiments 14, 79, and 80, which had z of 0, had Qm of 800 or more, which was higher than the Qm in Exemplary Embodiments 16 to 30, 47 to 50, 53 to 56, 81, and 82, which had z of more than 0. Thus, Exemplary Embodiments 14, 79, and 80 are more suitable for piezoelectric elements in terms of power saving in operation.

These results show that a piezoelectric material containing Sn and Bi according to an embodiment of the present invention had a high piezoelectric constant in a high temperature region and a high mechanical quality factor in a low temperature region in the device operation temperature range (−30° C. to 50° C.).

Manufacture and Evaluation of Multilayered Piezoelectric Element

A multilayered piezoelectric element according to an embodiment of the present invention was manufactured.

Exemplary Embodiment 83

A raw material having the composition $(Ba_{0.964}Ca_{0.036})_{1.0020}(Ti_{0.967}Sn_{0.033})O_3$, which is represented by the general formula (1) $(Ba_{1-x}Ca_x)_a(Ti_{1-y-z}Sn_yZr_z)O_3$, wherein x=0.036, y=0.033, z=0, and a=1.0020, was weighed as described below.

Barium carbonate having a purity of 99.99% or more, calcium carbonate having a purity of 99.99% or more, titanium oxide having a purity of 99.99% or more, and tin oxide having a purity of 99.99% or more were weighed as raw materials of the main component such that Ba, Ca, Ti, and Sn satisfied the composition $(Ba_{0.964}Ca_{0.036})_{1.0020}(Ti_{0.967}Sn_{0.033})O_3$.

Bismuth oxide was weighed such that the second auxiliary component Bi content on a metal basis was 0.280 parts by weight per 100 parts by weight of the composition $(Ba_{0.964}Ca_{0.036})_{1.0020}(Ti_{0.967}Sn_{0.033})O_3$.

Manganese dioxide was weighed such that the first auxiliary component Mn content on a metal basis was 0.150 parts by weight per 100 parts by weight of the composition $(Ba_{0.964}Ca_{0.036})_{1.0020}(Ti_{0.967}Sn_{0.033})O_3$.

Silicon dioxide was weighed such that the amount of third auxiliary component Si on a metal basis was 0.033 parts by weight per 100 parts by weight of the composition $(Ba_{0.964}Ca_{0.036})_{1.0020}(Ti_{0.967}Sn_{0.033})O_3$. Boron oxide was weighed such that the amount of third auxiliary component B on a metal basis was 0.017 parts by weight per 100 parts by weight of the composition $(Ba_{0.964}Ca_{0.036})_{1.0020}(Ti_{0.967}Sn_{0.033})O_3$.

The weighed powders were mixed with PVB and were formed into a green sheet having a thickness of 50 μm using a doctor blade method.

An electrically conductive paste for an internal electrode was applied to the green sheet. The electrically conductive paste was a 70% Ag-30% Pd alloy (Ag/Pd=2.33) paste. Nine of the green sheets to which the electrically conductive paste had been applied were stacked and were baked at 1200° C. for 4 hours to form a sintered body.

The composition of the piezoelectric material of the sintered body thus produced was analyzed using ICP spectroscopy. The result showed that the main component was a metal oxide represented by the chemical formula $(Ba_{0.964}Ca_{0.036})_{1.0020}(Ti_{0.967}Sn_{0.033})O_3$, the Mn content was 0.150 parts by weight per 100 parts by weight of the main component, and the Bi content was 0.280 parts by weight per 100 parts by weight of the main component. The composition of Ba, Ca, Ti, Sn, Mn, Bi, Si, and B weighed was the same as the composition after sintering.

The sintered body was cut into a 10 mm×2.5 mm piece. The side surfaces of the piece were polished. A pair of external electrodes (a first electrode and a second electrode) for alternately connecting internal electrodes were formed through a Au sputtering process. Thus, a multilayered piezoelectric element as illustrated in FIG. 2B was manufactured.

The multilayered piezoelectric element included nine piezoelectric material layers and eight internal electrodes. The observation of the internal electrodes of the multilayered piezoelectric element showed that the electrode material Ag—Pd layers and the piezoelectric material layers were alternately stacked on top of one another.

Before the evaluation of the piezoelectric property, a sample was subjected to polarization treatment. More specifically, the sample was heated to a temperature in the range of 100° C. to 150° C. on a hot plate. A voltage of 1.4 kV/mm was applied between the first electrode and the second electrode for 30 minutes, and the sample was cooled to room temperature while the voltage was maintained.

The multilayered piezoelectric element had substantially the same insulation property and piezoelectric property as the ceramic according to Exemplary Embodiment 1.

A multilayered piezoelectric element manufactured in the same manner except that Ni or Cu was used in the internal electrodes and sintering was performed in a low oxygen atmosphere also had substantially the same piezoelectric property.

Exemplary Embodiment 84

A multilayered piezoelectric element was manufactured in the same manner as in Exemplary Embodiment 83 except that barium titanate having a purity of 99.99% or more, calcium titanate having a purity of 99.99% or more, and calcium stannate having a purity of 99.99% or more were used as raw materials of the main component. The value a representing the ratio of the number of moles of Ba and Ca at the A site to the number of moles of Ti and Sn at the B site was adjusted with barium oxalate and calcium oxalate.

The composition of the piezoelectric material of the sintered body produced during the manufacture of the multilayered piezoelectric element was analyzed using ICP spectroscopy. The result showed that the main component was a metal oxide represented by the chemical formula $(Ba_{0.964}Ca_{0.036})_{1.0020}(Ti_{0.967}Sn_{0.033})O_3$, the Mn content was 0.15 parts by weight per 100 parts by weight of the main component, and the Bi content was 0.28 parts by weight per 100 parts by weight of the main component. The composition of Ba, Ca, Ti, Sn, Mn, Bi, Si, and B weighed was the same as the composition after sintering.

The multilayered piezoelectric element included nine piezoelectric material layers and eight internal electrodes. The evaluation of the piezoelectric property of the multilayered piezoelectric element showed that the multilayered piezoelectric element had a satisfactory insulation property and a better piezoelectric property than Exemplary Embodiment 83 by 5% or more. This is probably because use of a perovskite-type metal oxide as a raw material promoted the grain growth and increased the density of the piezoelectric material layers.

Comparative Example 25

A multilayered piezoelectric element was manufactured in the same manner as in Exemplary Embodiment 83. The multilayered piezoelectric element had the same composition as Comparative Example 16. The baking temperature was 1300° C. The internal electrodes were formed of a 95% Ag-5% Pd alloy (Ag/Pd=19). The internal electrodes were observed with a scanning electron microscope. The observation showed that the internal electrodes were melted and interspersed as islands. Thus, the internal electrodes were not conductive, and the multilayered piezoelectric element was not polarized. Thus, the piezoelectric property could not be evaluated.

Comparative Example 26

A multilayered piezoelectric element was manufactured in the same manner as in Comparative Example 25 except that the internal electrodes were formed of a 5% Ag-95% Pd alloy (Ag/Pd=0.05). The internal electrodes were observed with a scanning electron microscope. The observation showed that sintering of the electrode material Ag—Pd was insufficient. Thus, the internal electrodes were not conductive, and the multilayered piezoelectric element was not polarized. Thus, the piezoelectric property could not be evaluated.

Exemplary Embodiment 85

A liquid discharge head illustrated in FIGS. 3A and 3B was manufactured using a piezoelectric element manufactured using the piezoelectric material according to Exemplary Embodiment 1. An ink was discharged in response to the input of an electric signal. When the liquid discharge head was operated using a nonaqueous ink in a thermostat at 0° C., the ink was discharged at a lower voltage than discharging at room temperature and at substantially the same efficiency as discharging at room temperature.

Exemplary Embodiment 86

A liquid discharge apparatus illustrated in FIG. 4 was manufactured using the liquid discharge head according to Exemplary Embodiment 85. An ink discharged in response to the input of an electric signal was observed on a transfer medium. When the liquid discharge apparatus was operated using a nonaqueous ink in a thermostat at 0° C., the ink was discharged onto a transfer medium at a lower voltage than discharging at room temperature and at substantially the same efficiency as discharging at room temperature.

Exemplary Embodiment 87

An ultrasonic motor illustrated in FIG. 6A was manufactured using a piezoelectric element manufactured using the piezoelectric material according to Exemplary Embodiment 1. The ultrasonic motor rotated upon the application of an alternating voltage.

The ultrasonic motor rotated in a thermostat at −30° C. at higher efficiency than operation at room temperature.

Comparative Example 27

An ultrasonic motor illustrated in FIG. 6A was manufactured using a piezoelectric element manufactured using the piezoelectric material according to Comparative Example 24. The ultrasonic motor rotated at room temperature upon the application of an alternating voltage. However, the ultrasonic motor did not rotate in a thermostat at −30° C. even when the applied voltage was increased, and only the power consumption increased.

Exemplary Embodiment 88

An optical apparatus illustrated in FIGS. 7A and 7B was manufactured using the ultrasonic motor according to Exemplary Embodiment 87. The optical apparatus performed autofocusing upon the application of an alternating voltage. The optical apparatus performed autofocusing in a thermostat at −30° C. in the same manner as at room temperature.

Exemplary Embodiment 89

A dust removing device illustrated in FIGS. 9A and 9B was manufactured using a piezoelectric element manufactured using the piezoelectric material according to Exemplary Embodiment 1. After plastic beads were scattered, the dust removing device efficiently removed the plastic beads upon the application of an alternating voltage. The dust removing efficiency of the dust removing device in a thermostat at −30° C. was higher than that at room temperature.

Exemplary Embodiment 90

An image pickup apparatus illustrated in FIG. 12 was manufactured using the dust removing device according to Exemplary Embodiment 89. Dust on the surface of the image pickup unit was satisfactorily removed, and images free of dust defects were obtained. Images taken with the image pickup apparatus in a thermostat at −30° C. were substantially the same as images taken at room temperature.

Exemplary Embodiment 91

Electronic equipment illustrated in FIG. 14 was manufactured using the piezoelectric element according to Exemplary Embodiment 1. A loudspeaker of the electronic equipment operated upon the application of an alternating voltage. The loudspeaker of the electronic equipment in a thermostat at −30° C. operated in the same manner as at room temperature.

Exemplary Embodiment 92

A liquid discharge head illustrated in FIGS. 3A and 3B was manufactured using the multilayered piezoelectric element according to Exemplary Embodiment 83. An ink was discharged in response to the input of an electric signal. When the liquid discharge head was operated using a nonaqueous ink in a thermostat at 0° C., the ink was discharged at a lower voltage than discharging at room temperature and at substantially the same efficiency as discharging at room temperature.

Exemplary Embodiment 93

A liquid discharge apparatus illustrated in FIG. 4 was manufactured using the liquid discharge head according to Exemplary Embodiment 92. An ink discharged in response to the input of an electric signal was observed on a transfer medium. When the liquid discharge apparatus was operated using a nonaqueous ink in a thermostat at 0° C., the ink was discharged onto a transfer medium at a lower voltage than discharging at room temperature and at substantially the same efficiency as discharging at room temperature.

Exemplary Embodiment 94

An ultrasonic motor illustrated in FIG. 6B was manufactured using the multilayered piezoelectric element according to Exemplary Embodiment 83. The motor rotated upon the application of an alternating voltage. The ultrasonic motor rotated in a thermostat at −30° C. at higher efficiency than operation at room temperature.

Exemplary Embodiment 95

An optical apparatus illustrated in FIGS. 7A and 7B was manufactured using the ultrasonic motor according to Exemplary Embodiment 94. The optical apparatus performed autofocusing upon the application of an alternating voltage. The optical apparatus performed autofocusing in a thermostat at −30° C. in the same manner as at room temperature.

Exemplary Embodiment 96

A dust removing device illustrated in FIGS. 9A and 9B was manufactured using the multilayered piezoelectric element according to Exemplary Embodiment 83. After plastic beads were scattered, the dust removing device efficiently removed the plastic beads upon the application of an alternating voltage. The dust removing efficiency of the dust removing device in a thermostat at −30° C. was higher than that at room temperature.

Exemplary Embodiment 97

An image pickup apparatus illustrated in FIG. 12 was manufactured using the dust removing device according to Exemplary Embodiment 96. Dust on the surface of the image pickup unit was satisfactorily removed, and images free of dust defects were obtained. Images taken with the image pickup apparatus in a thermostat at −30° C. were substantially the same as images taken at room temperature.

Exemplary Embodiment 98

Electronic equipment illustrated in FIG. 14 was manufactured using the multilayered piezoelectric element according to Exemplary Embodiment 83. A loudspeaker of the electronic equipment operated upon the application of an alternating voltage. The loudspeaker of the electronic equipment in a thermostat at −30° C. operated in the same manner as at room temperature.

A piezoelectric material according to an embodiment of the present invention has a high piezoelectric constant and a high mechanical quality factor in a device operation temperature range (−30° C. to 50° C.) The piezoelectric material contains no lead and can reduce the load on the environment. Thus, a piezoelectric material according to an embodiment of the present invention can be used for apparatuses manufactured using a large amount of piezoelectric material, such as liquid discharge heads, ultrasonic motors, and dust removing devices, without problems.

While the present invention has been described with reference to exemplary embodiments, it is to be understood that the invention is not limited to the disclosed exemplary embodiments. The scope of the following claims is to be accorded the broadest interpretation so as to encompass all such modifications and equivalent structures and functions.

This application claims the benefit of Japanese Patent Application No. 2013-146310, filed Jul. 12, 2013, which is hereby incorporated by reference herein in its entirety.

What is claimed is:

1. A piezoelectric material, comprising:
a main component containing a perovskite-type metal oxide represented by the following general formula (1);
a first auxiliary component composed of Mn; and
a second auxiliary component composed of Bi or Bi and Li,
wherein the Mn content is 0.04 parts by weight or more and 0.400 parts by weight or less on a metal basis per 100 parts by weight of the metal oxide, the Bi content is 0.042 parts by weight or more and 0.850 parts by weight or less on a metal basis per 100 parts by weight of the metal oxide, and the Li content is 0.028 parts by weight or less (including 0 parts by weight) on a metal basis per 100 parts by weight of the metal oxide,

$$(Ba_{1-x}Ca_x)_a(Ti_{1-y-z}Sn_yZr_z)O_3 \quad (1)$$

(wherein x is in the range of $0 \leq x \leq 0.080$, y is in the range of $0.013 \leq y \leq 0.060$, z is in the range of $0 \leq z \leq 0.040$, and a is in the range of $0.986 \leq a \leq 1.020$).

2. The piezoelectric material according to claim 1, further comprising a third auxiliary component containing at least one of Si and B, wherein the third auxiliary component content is 0.001 parts by weight or more and 4.000 parts by weight or less on a metal basis per 100 parts by weight of the perovskite-type metal oxide represented by the general formula (1).

3. The piezoelectric material according to claim 1, wherein x of the general formula (1) is in the range of $0.02 \leq x \leq 0.08$.

4. The piezoelectric material according to claim 1, wherein x of the general formula (1) is in the range of $0.03 \leq x \leq 0.08$, and z is in the range of $0.021 \leq z \leq 0.038$.

5. The piezoelectric material according to claim 1, wherein the piezoelectric material contains crystal grains having an average equivalent circular diameter of 0.5 μm or more and 10 μm or less.

6. The piezoelectric material according to claim 1, wherein the piezoelectric material has a relative density of 93% or more and 100% or less.

7. A piezoelectric element, comprising:
a first electrode;
a piezoelectric material portion; and
a second electrode,
wherein the piezoelectric material portion includes the piezoelectric material according to claim 1.

8. A liquid discharge head, comprising:
a liquid chamber having a vibrating portion that includes the piezoelectric element according to claim 7; and
an orifice for discharging in communication with the liquid chamber.

9. A liquid discharge apparatus, comprising:
a stage configured to receive an object; and
the liquid discharge head according to claim 8.

10. An ultrasonic motor, comprising:
a vibrating member that includes the piezoelectric element according to claim 7; and
a moving body in contact with the vibrating member.

11. An optical apparatus, comprising a drive unit that includes the ultrasonic motor according to claim 10.

12. A vibratory apparatus, comprising a vibrating member that includes the piezoelectric element according to claim 7 on a diaphragm.

13. A dust removing device, comprising the vibratory apparatus according to claim 12 in a vibrating portion.

14. An image pickup apparatus, comprising:
the dust removing device according to claim 13; and
an image pickup element unit,
wherein the diaphragm of the dust removing device is disposed on a light-receiving surface side of the image pickup element unit.

15. Electronic equipment, comprising a piezoelectric acoustic component that includes the piezoelectric element according to claim 7.

16. A multilayered piezoelectric element, comprising:
piezoelectric material layers and electrode layers alternately stacked on top of one another, the electrode layers including an internal electrode,
wherein the piezoelectric material layers contain the piezoelectric material according to claim 1.

17. The multilayered piezoelectric element according to claim 16, wherein the internal electrode contains Ag and Pd, and the weight ratio M1/M2 of the weight M1 of Ag to the weight M2 of Pd is in the range of $0.25 \leq M1/M2 \leq 4.0$.

18. The multilayered piezoelectric element according to claim 16, wherein the internal electrode contains at least one of Ni and Cu.

19. A liquid discharge head, comprising:
a liquid chamber having a vibrating portion that includes the multilayered piezoelectric element according to claim 16; and
an orifice for discharging in communication with the liquid chamber.

20. A liquid discharge apparatus, comprising:
a stage configured to receive an object; and
the liquid discharge head according to claim 19.

21. An ultrasonic motor, comprising:
a vibrating member that includes the multilayered piezoelectric element according to claim 16; and
a moving body in contact with the vibrating member.

22. An optical apparatus, comprising a drive unit that includes the ultrasonic motor according to claim 21.

23. A vibratory apparatus, comprising a vibrating member that includes the multilayered piezoelectric element according to claim 16 on a diaphragm.

24. A dust removing device, comprising the vibratory apparatus according to claim 23 in a vibrating portion.

25. An image pickup apparatus, comprising:
   the dust removing device according to claim 24; and
   an image pickup element unit,
      wherein the diaphragm of the dust removing device is disposed on a light-receiving surface side of the image pickup element unit.

26. Electronic equipment, comprising a piezoelectric acoustic component that includes the multilayered piezoelectric element according to claim 16.

* * * * *